US012703798B2

(12) United States Patent
Kim et al.

(10) Patent No.: US 12,703,798 B2
(45) Date of Patent: Aug. 11, 2026

(54) COMPOSITIONS FOR MANUFACTURING THIN FILM AND METHODS FOR MANUFACTURING SEMICONDUCTOR DEVICE USING THE SAME

(71) Applicant: Samsung Electronics Co., Ltd., Suwon-si (KR)

(72) Inventors: Jae Woon Kim, Seoul (KR); Seung-Min Ryu, Hwaseong-si (KR); Haruyoshi Sato, Tokyo (JP); Kazuya Saito, Tokyo (JP); Masayuki Kimura, Tokyo (JP); Takahiro Yoshii, Tokyo (JP); Tsubasa Shiratori, Tokyo (JP); Min Jae Sung, Seoul (KR); Gyu-Hee Park, Hwaseong-si (KR); Youn Joung Cho, Hwaseong-si (KR)

(73) Assignees: Samsung Electronics Co., Ltd., Suwon-si (KR); Adeka Corporation, Tokyo (JP)

( * ) Notice: Subject to any disclaimer, the term of this patent is extended or adjusted under 35 U.S.C. 154(b) by 580 days.

(21) Appl. No.: 18/145,142

(22) Filed: Dec. 22, 2022

(65) Prior Publication Data

US 2023/0220213 A1 Jul. 13, 2023

(30) Foreign Application Priority Data

Jan. 7, 2022 (KR) ........................ 10-2022-0002826

(51) Int. Cl.
*C09D 1/00* (2006.01)
*C07F 3/00* (2006.01)
*H10B 12/00* (2023.01)

(52) U.S. Cl.
CPC ................ *C09D 1/00* (2013.01); *C07F 3/003* (2013.01); *H10B 12/033* (2023.02)

(58) Field of Classification Search
CPC .......... C09D 1/00; C07F 3/003; H10B 12/033
See application file for complete search history.

(56) References Cited

U.S. PATENT DOCUMENTS

| | | | |
|---|---|---|---|
| 5,045,348 | A | 9/1991 | Brierley et al. |
| 5,116,785 | A | 5/1992 | Mackey et al. |
| 5,225,561 | A | 7/1993 | Kirlin et al. |
| 5,258,204 | A | 11/1993 | Wernberg et al. |
| 6,338,873 | B1 | 1/2002 | Paw et al. |
| 6,620,971 | B2 | 9/2003 | Chang et al. |
| 7,112,690 | B2 | 9/2006 | Chi et al. |
| 7,439,338 | B2 | 10/2008 | Millward et al. |
| 8,686,138 | B2 | 4/2014 | Korolev et al. |
| 2010/0003532 | A1 | 1/2010 | Feist et al. |

FOREIGN PATENT DOCUMENTS

| | | | |
|---|---|---|---|
| JP | H0474866 | A | 3/1992 |
| JP | H11241166 | A | 9/1999 |
| KR | 20020022210 | A | 3/2002 |
| KR | 10-0636023 | B1 | 10/2006 |
| KR | 10-2008-0017401 | A | 2/2008 |
| KR | 20080021709 | A | 3/2008 |
| WO | 0023635 | A1 | 4/2000 |

OTHER PUBLICATIONS

Malandrino et al., Inorganic Chimica Acta, (1994), 224(1-2), p. 203-207.*
Belot et al., Chem. Mater., (1997), 9(7), p. 1638-1648.*
Khamylov et al., Russian Journal of Coordination Chemistry, (2008), 34(12), p. 884-890.*
Shuster et al., MOCVD growth of barium-strontium titanate films using newly developed barium and strontium precursors. Thin Solid Films. Jun. 1, 2010;518(16):4658-61.

* cited by examiner

*Primary Examiner* — Yong L Chu
(74) *Attorney, Agent, or Firm* — Wolf, Greenfield & Sacks, P.C.

(57) ABSTRACT

Compositions for manufacturing a thin film are provided. The compositions may include a compound having a structure of Chemical Formula 1:

[Chemical Formula 1]

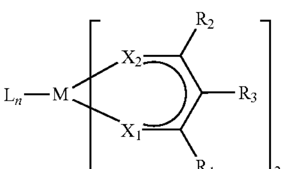

M may be strontium (Sr) or barium (Ba), $X_1$ and $X_2$ may each independently be oxygen (O) or a substituted or unsubstituted alkylamino group having 1 to 5 carbon atoms, $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, L may be a substituted or unsubstituted polyether having 1 to 6 oxygen atoms, or a substituted or unsubstituted polyamine having 1 to 6 nitrogen atoms, or a substituted or unsubstituted polyetheramine having 1 to 6 oxygen atoms or nitrogen atoms, and n may be an integer of 1 to 6.

15 Claims, 14 Drawing Sheets

COMPOSITIONS FOR MANUFACTURING THIN FILM AND METHODS FOR MANUFACTURING SEMICONDUCTOR DEVICE USING THE SAME

CROSS-REFERENCE TO RELATED APPLICATION

This application claims priority to Korean Patent Application No. 10-2022-0002826 filed on Jan. 7, 2022 in the Korean Intellectual Property Office, and all the benefits accruing therefrom under 35 U.S.C. 119, the contents of which in its entirety are herein incorporated by reference.

BACKGROUND

The present disclosure relates to a composition for manufacturing a thin film and a method for manufacturing a semiconductor device using the same, and more specifically, to a composition for depositing a thin film including strontium (Sr) and barium (Ba).

Recently, with rapid spread of information media, a function of a semiconductor device is rapidly developing. Semiconductor devices with high integration density may be beneficial for low cost and high quality to secure competitiveness. For high integration density, semiconductor devices have been being scaled down.

In this regard, as a size of a pitch decreases, a material of a dielectric film used for a capacitor of a semiconductor device, for example, DRAM becomes one of important factors. The dielectric film containing strontium (Sr) or barium (Ba) may have a high dielectric constant and may be used in a next-generation DRAM capacitor.

SUMMARY

A technical purpose to be achieved by the present disclosure is to provide a composition for manufacturing a thin film with improved stability and mass productivity.

Another technical purpose to be achieved by the present disclosure is to provide a method for manufacturing a semiconductor device using a composition for manufacturing a thin film with improved stability and mass productivity.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, the signal will be easily understood that the purposes and advantages according to the present disclosure may be realized using means shown in the claims and combinations thereof.

According to an aspect of the present disclosure, there is provided a composition for manufacturing a thin film, the composition comprising a compound having a structure of Chemical Formula 1:

[Chemical Formula 1]

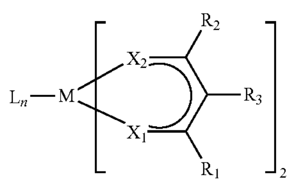

M may be strontium (Sr) or barium (Ba), $X_1$ and $X_2$ may each independently be oxygen (O) or a substituted or unsubstituted alkylamino group having 1 to 5 carbon atoms, $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, L may be a substituted or unsubstituted polyether having 1 to 6 oxygen atoms, or a substituted or unsubstituted polyamine having 1 to 6 nitrogen atoms, or a substituted or unsubstituted polyetheramine having 1 to 6 oxygen atoms or nitrogen atoms, and n may be an integer of 1 to 6 (i.e., 1, 2, 3, 4, 5 or 6).

According to another aspect of the present disclosure, there is provided a composition for manufacturing a thin film, the composition comprising a compound having a structure of Chemical Formula 3:

[Chemical Formula 3]

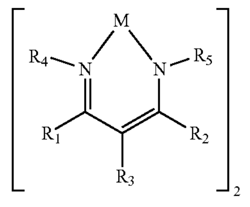

M may be strontium (Sr), or barium (Ba), $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, $R_4$ and $R_5$ may each independently be a substituted or unsubstituted alkyl group having 1 to 5 carbon atoms or a substituted or unsubstituted perfluoro alkyl group having 1 to 5 carbon atoms, and $R_1$ and the $R_2$ may be different from each other.

According to another aspect of the present disclosure, there is provided a method for manufacturing a semiconductor device, the method comprising, providing a substrate including an active region, forming a lower electrode on the substrate so as to be connected to the active region, and forming a capacitor dielectric film disposed along a profile of the lower electrode, wherein forming the capacitor dielectric film includes sequentially providing a composition for manufacturing a thin film, and a metal, wherein the composition for manufacturing the thin film includes a compound having a structure of Chemical Formula 1:

[Chemical Formula 1]

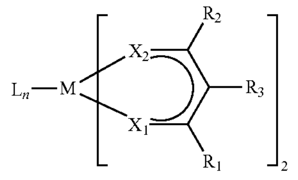

M may be strontium (Sr) or barium (Ba), $X_1$ and $X_2$ may each independently be oxygen (O) or a substituted or unsubstituted alkylamino group having 1 to 5 carbon atoms, $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, L may be a substituted or unsubstituted polyether having 1 to 6 oxygen atoms, or a substituted or unsubstituted polyamine having 1 to 6 nitrogen atoms, or a substituted or unsubstituted polyetheramine having 1 to 6 oxygen atoms or nitrogen atoms, and n may be an integer of 1 to 6 (i.e., 1, 2, 3, 4, 5 or 6).

BRIEF DESCRIPTION OF DRAWINGS

The above and other aspects and features of the present invention will become more apparent by describing in detail example embodiments thereof with reference to the attached drawings, in which.

DETAILED DESCRIPTIONS

Figure 1:
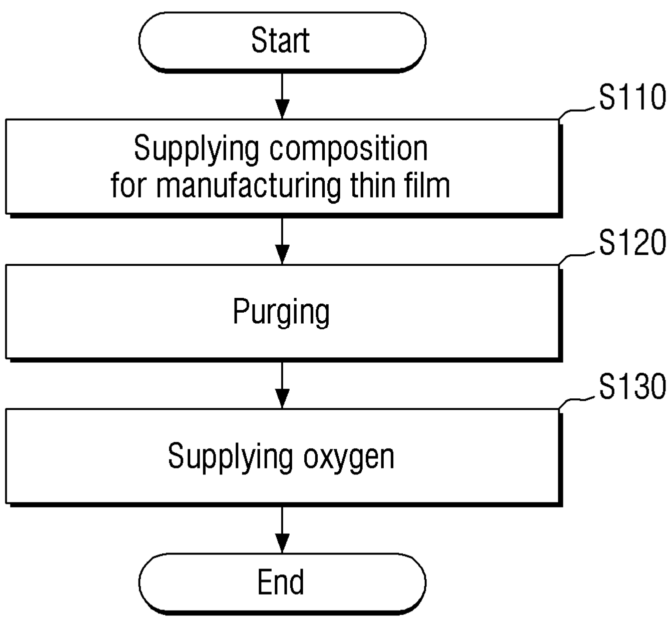
FIGS. 1 and 2 are flowcharts illustrating a method of manufacturing a thin film using a composition for manufacturing a thin film according to some embodiments of the present invention.

As used herein, "substituted or unsubstituted" means that a hydrogen atom is unsubstituted or is substituted with one or more substituents selected from a group consisting of a deuterium atom, a halogen atom, an alkyl group, a hydroxyl group, an alkoxy group, an ether group, an acetal group, a halogenated alkyl group, a halogenated alkoxy group, a halogenated ether group, an alkenyl group, a thio group, a sulfinyl group, a sulfonyl group, a carbonyl group, a phosphine oxide group, a phosphine sulfide group, an aryl group, a hydrocarbon ring group, and a heterocyclic group. Further, each of the substituents exemplified above may be substituted or unsubstituted. For example, a halogenated alkyl group may be interpreted as an alkyl group that is substituted with a halogen. An alkylsulfonate group, an alkylthio group, an alkylsulfoxy group, an alkylcarbonyl group, an alkylester group, an alkylether group, and an alkylacetal group may be respectively interpreted as a sulfonate group, a thio group, a sulfoxy group, a carbonyl group, an ester group, an ether group, and an acetal group.

As used herein, the carbonyl group may be a substituted or unsubstituted carbonyl group unless otherwise specified. The ester group may be a substituted or unsubstituted ester group unless otherwise specified. The acetal group may be a substituted or unsubstituted acetal group unless otherwise specified.

As used herein, "to bind to an adjacent group form a ring" may mean binding to an adjacent group to form a substituted or unsubstituted hydrocarbon ring or a substituted or unsubstituted hetero ring. The hydrocarbon ring includes an aliphatic hydrocarbon ring and an aromatic hydrocarbon ring. The hetero ring includes an aliphatic hetero ring and an aromatic hetero ring. Each of the hydrocarbon ring and the hetero ring may be monocyclic or polycyclic. Further, a ring formed by binding to an adjacent group may be connected to another ring to form a spiro structure.

As used herein, the alkyl group may be a linear alkyl group, a branched alkyl group, or a cyclic alkyl group. The alkyl group may include primary alkyl, secondary alkyl, and tertiary alkyl. The number of carbon atoms in the alkyl group is not particularly limited. In some embodiments, the alkyl group may be an alkyl group having 1 to 7 carbon atoms, more specifically, an alkyl group having 1 to 5 carbon atoms.

As used herein, the alkyl group of an alkylsulfonate group, an alkylthio group, an alkylsulfoxy group, an alkylcarbonyl group, an alkylester group, an alkylether group, or an alkylacetal group may include the example of the alkyl group as described above. As used herein, a halogen element may include fluorine, chlorine, iodine, and/or bromine.

Unless otherwise defined in the Chemical Formula herein, when a chemical bond is not drawn at a position where a chemical bond is to be drawn, this may mean that a hydrogen atom is bonded to the position.

As used herein, like reference numerals may refer to like elements.

Hereinafter, a composition for manufacturing a thin film according to some embodiments will be described.

In some embodiments, a composition for manufacturing a thin film may be used for forming a thin film or manufacturing a semiconductor device. For example, a composition for manufacturing a thin film may be used as a precursor to form a high dielectric constant film. Specifically, the composition for manufacturing the thin film according to some embodiments may be a precursor used in a thin film deposition process including a vapor process such as a chemical vapor deposition (CVD), or an atomic layer deposition (ALD).

In some embodiments, the composition for manufacturing the thin film may include a material (e.g., a compound) represented by a following Chemical Formula 1:

[Chemical Formula 1]

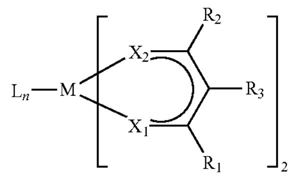

The composition may include a compound having a structure of Chemical Formula 1. M may be strontium (Sr) or barium (Ba), $X_1$ and $X_2$ may each independently be oxygen (O) or a substituted or unsubstituted alkylamino group having 1 to 5 carbon atoms, $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, L may be a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n may be an integer of 1 to 6 (i.e., 1, 2, 3, 4, 5 or 6). Although Chemical Formula 1 shows one bond for the L group, in some embodiments, two or more portions of one L may bond to M (e.g., Sr or Ba), including two or more (e.g., 2, 3, 4, 5, or 6) oxygen and/or nitrogen groups. For example, when L is a polyether, two or more of the oxygen atoms of the polyether may bind to M. As another example, when L is a polyamine, two or more of the nitrogen atoms in the polyamine may bind to M.

The substituted or unsubstituted alkyl group having 1 to 5 carbon atoms may include, for example, a methyl group, an ethyl group, a n-propyl group, an isopropyl group, a n-butyl group, a tert-butyl group, a sec-butyl group, a pentyl group, an isopentyl group, and a neopentyl group.

In some embodiments, each of $R_1$ and $R_2$ may preferably be a secondary alkyl group or a tertiary alkyl group. More preferably, each of $R_1$ and $R_2$ may be a secondary alkyl group, for example, an isopropyl group. When each of $R_1$ and $R_2$ is the isopropyl group or a tert-butyl group, a thickness distribution of the thin film as manufactured may be small, and accordingly, a flat thin film (e.g., a thin film having a uniform thickness) may be manufactured.

In some embodiments, preferably, $R_3$ may be hydrogen or a methyl group, and more preferably, $R_3$ may be hydrogen.

In some embodiments, $R_1$ and $R_2$ may be different functional groups. That is, $R_1$ and $R_2$ may be asymmetric with respect to each other. Preferably, $R_1$ may be a perfluoroalkyl group such as $—CF_3$, while $R_2$ may be a perfluoroalkyl group such as $—CF_3$ or $—CF_2CF_2CF_3$. However, the present disclosure is not limited thereto. Due to the structure in which $R_1$ and $R_2$ are asymmetric with respect to each other, a melting point of the composition for manufacturing the thin film according to some embodiments may be lowered, and thus, volatility thereof may be increased. When the melting point of the composition for manufacturing the thin film is lowered and the volatility thereof is increased, mass productivity and stability of the thin film manufactured using the composition for manufacturing the thin film may be improved.

In some embodiments, $X_1$ and $X_2$ may be the same functional group or different functional groups.

In some embodiments, L may include a material (e.g., a compound) represented by a following Chemical Formula 2:

[Chemical Formula 2]

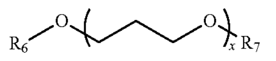

L may include a structure of Chemical Formula 2. $R_6$ and $R_7$ may each independently be a methyl group, an ethyl group, an n-propyl group, an isopropyl group, an n-butyl group, a tert-butyl group, a sec-butyl group, or a substituted or unsubstituted perfluoroalkyl group having 1 to 4 carbon atoms, and X may be an integer of 1 to 5 (e.g., 1, 2, 3, 4 or 5).

Preferably, $R_6$ may be a methyl group and $R_7$ may be an isopropyl group, and X may be 4. However, the present disclosure is not limited thereto.

In some embodiments, L may include at least one of diglyme, or tetraethylene glycol dimethyl ether (tetraglyme). In another embodiment, L may include at least one of TMEDA (tetramethlyethlyenediamine), or HMTETA (hexamethyltriethylenetriamine). However, the technical idea of the present disclosure is not limited thereto.

In some embodiments, as L contains a neutral ligand such as polyether, or polyamine, or polyetheramine, the melting point of the compound for manufacturing the thin film including L may be lowered, and volatility thereof may be increased. When the melting point of the compound for manufacturing the thin film is lowered and the volatility thereof is increased, mass productivity and stability of the thin film manufactured using the compound and/or a composition for manufacturing the thin film may be improved.

The compound and/or composition for manufacturing the thin film may supply a metal material, for example, strontium (Sr) or barium (Ba) to the thin film when the thin film is formed on a substrate. The thin film manufactured using the composition for manufacturing the thin film according to some embodiments may include, for example, at least one of $SrTiO_3$, $BaTiO_3$, or $SrBaTi_2O_6$.

In some embodiments, the compound represented by Chemical Formula 1 may be in a liquid state at room temperature. The melting point of the compound represented by Chemical Formula 1 may be 60° C. or lower. Since the compound represented by Chemical Formula 1 is in a liquid state at room temperature, thermal stability of the thin film may be improved when the thin film is formed using the composition for manufacturing the thin film including the compound represented by Chemical Formula 1.

In some embodiments, the composition for manufacturing the thin film may include a material (e.g., a compound) represented by a following Chemical Formula 3:

[Chemical Formula 3]

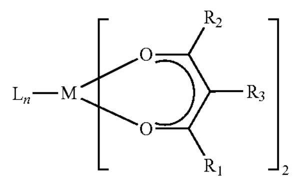

The compound may have a structure of Chemical Formula 3. M may be strontium (Sr) or barium (Ba), $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, L may be a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n may be an integer of 1 to 6 (i.e., 1, 2, 3, 4, 5 or 6).

In some embodiments, $R_1$ and $R_2$ may be asymmetric with respect to each other. However, the disclosure is not limited thereto. Preferably, each of $R_1$ and $R_2$ may be a secondary alkyl group or a tertiary alkyl group.

In some embodiments, the composition for manufacturing the thin film may include a material (e.g., a compound) represented by a following Chemical Formula 4:

[Chemical Formula 4]

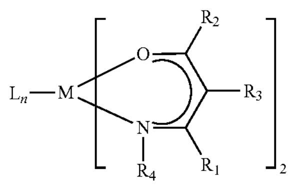

The compound may have a structure of Chemical Formula 4. M may be strontium (Sr) or barium (Ba), $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, $R_4$ may be a substituted or unsubstituted alkyl group having 1 to 5 carbon atoms or a substituted or unsubstituted perfluoro alkyl group having 1 to 5 carbon atoms, L may be a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n may be an integer of 1 to 6 (i.e., 1, 2, 3, 4, 5 or 6).

In some embodiments, $R_1$ and $R_2$ may be asymmetric with respect to each other. However, the disclosure is not limited thereto. Preferably, each of $R_1$ and $R_2$ may be a secondary alkyl group or a tertiary alkyl group.

In some embodiments, the composition for manufacturing the thin film may include a material (e.g., a compound) represented by a following Chemical Formula 5:

[Chemical Formula 5]

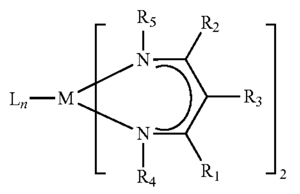

The compound may have a structure of Chemical Formula 5. M may be strontium (Sr) or barium (Ba), $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, $R_4$ and $R_5$ may each independently be a substituted or unsubstituted alkyl group having 1 to 5 carbon atoms or a substituted or unsubstituted perfluoro alkyl group having 1 to 5 carbon atoms, L may be a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n may be an integer of 1 to 6 (i.e., 1, 2, 3, 4, 5 or 6).

In some embodiments, $R_4$ and $R_5$ may be the same functional group or different functional groups. $R_4$ and $R_5$ may be symmetric with respect to each other or may be asymmetric with respect to each other.

In some embodiments, preferably, the composition for manufacturing the thin film may include a material (e.g., a compound) represented by a following Chemical Formula 6:

[Chemical Formula 6]

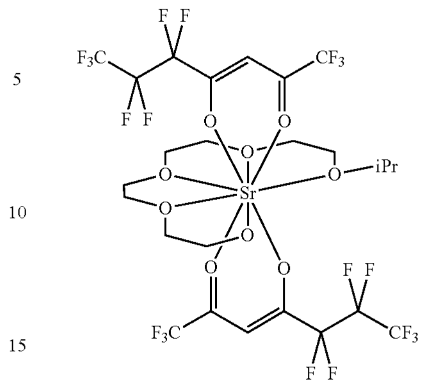

The compound may have a structure of Chemical Formula 6. M (a metal material in Chemical Formula 1) may include strontium (Sr). The composition for manufacturing the thin film may include a neutral ligand (L in Chemical Formula 1) which binds to strontium (Sr). The neutral ligand may be polyether. However, the technical idea of the present disclosure is not limited thereto.

The compound represented by Chemical Formula 6 may be in a liquid state at room temperature. That is, a melting point of the compound represented by Chemical Formula 6 may be about 30° C. or lower. The melting point of the compound represented by Chemical Formula 6 is low. Thus, when the thin film is formed using the composition for manufacturing the thin film including the compound represented by Chemical Formula 6, the stability of the process of forming the thin film may be improved and the mass productivity of the thin film as manufactured may be improved.

In some embodiments, preferably, the composition for manufacturing the thin film may include a material (e.g., a compound) represented by a following Chemical Formula 7:

[Chemical Formula 7]

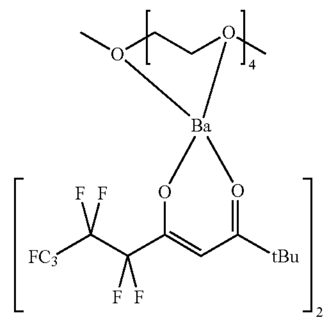

The compound may have a structure of Chemical Formula 6. M (the metal material in Chemical Formula 1) may include barium (Ba). The compound for manufacturing the thin film may include a neutral ligand (L in Chemical Formula 1) that binds to barium (Ba). The neutral ligand may be polyether. However, the technical idea of the present disclosure is not limited thereto.

A melting point of the compound represented by Chemical Formula 7 may be about 44° C. Since the melting point of the compound represented by Chemical Formula 7 is low, the thermal stability of the composition for manufacturing the thin film including the compound represented by Chemical Formula 7 may be improved.

The composition for manufacturing the thin film according to some embodiments may not include a neutral ligand. In some embodiments, the composition for manufacturing the thin film may include a material (e.g., a compound) represented by a following Chemical Formula 8:

[Chemical Formula 8]

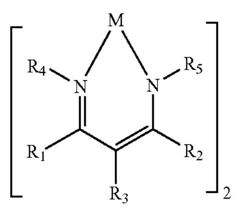

The compound may have a structure of Chemical Formula 8. M may be strontium (Sr), or barium (Ba), $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, $R_4$ and $R_5$ may each independently be a substituted or unsubstituted alkyl group having 1 to 5 carbon atoms or a substituted or unsubstituted perfluoro alkyl group having 1 to 5 carbon atoms, and $R_1$ and $R_2$ may be different functional groups. That is, $R_1$ and $R_2$ may be asymmetric with respect to each other.

In some embodiments, $R_4$ and $R_5$ may be the same functional group, or may be different functional groups. Preferably, $R_4$ and $R_5$ may be different functional groups. $R_4$ and $R_5$ may be asymmetric with respect to each other.

In some embodiments, a melting point of the compound represented by Chemical Formula 8 may be 60° C. or lower.

Preferably, the composition for manufacturing the thin film may include a material (e.g., a compound) represented by a following Chemical Formula 9. The compound may have a structure of Chemical Formula 9, which is an example of Chemical Formula 8. Referring to Chemical Formula 8 and Chemical Formula 9, $R_1$ and $R_2$ may be different functional groups, for example, isopropyl group, and methyl group. $R_4$ and $R_5$ may be the same functional group, for example, isopropyl group. $R_3$ may be hydrogen. However, the technical idea of the present disclosure is not limited thereto.

[Chemical Formula 9]

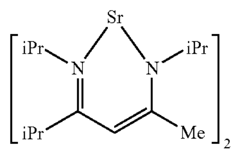

Preferably, the composition for manufacturing the thin film may include a material (e.g., a compound) represented by a following Chemical Formula 10. The compound may have a structure of Chemical Formula 10, which is an example of Chemical Formula 8. Referring to Chemical Formula 8 and Chemical Formula 10, $R_1$ and $R_2$ may be the same functional group, for example, a methyl group. $R_4$ and $R_5$ may be different functional groups. $R_3$ may be hydrogen. However, the technical idea of the present disclosure is not limited thereto.

[Chemical Formula 10]

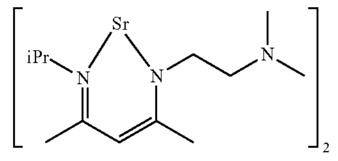

Hereinafter, with reference to Present Examples and Comparative Examples of the present disclosure, efficiency of the composition for manufacturing the thin film according to some embodiments will be described.

Comparative Example 1

A compound represented by a following Chemical Formula 1-a is subjected to thermogravimetric analysis (TGA) to measure a melting point of the compound represented by the following Chemical Formula 1-a. The compound represented by Chemical Formula 1-a does not contain a neutral ligand that binds to strontium (Sr).

[Chemical Formula 1-a]

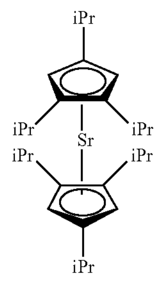

Comparative Example 2

A compound represented by a following Chemical Formula 1-b is subjected to thermogravimetric analysis (TGA) to measure a melting point of the compound represented by the following Chemical Formula 1-b. The compound represented by Chemical Formula 1-b does not contain a neutral ligand that binds to strontium (Sr).

[Chemical Formula 1-b]

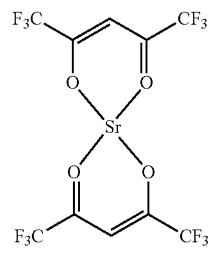

Present Example 1

A compound represented by a following Chemical Formula 6 is subjected to thermogravimetric analysis (TGA) to measure a melting point of the compound represented by the following Chemical Formula 6. The compound represented by Chemical Formula 6 contains a neutral ligand bonded to strontium (Sr), and the neutral ligand is polyether.

[Chemical Formula 6]

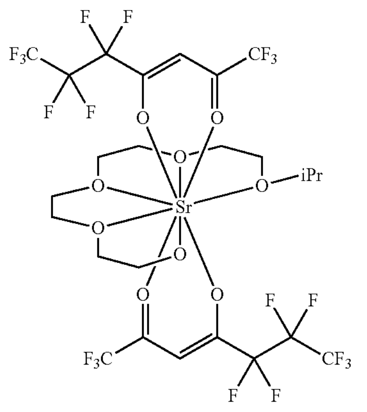

Table 1 shows results of measuring a temperature of TGA50% and a melting point of each of Comparative Example 1, Comparative Example 2, and Present Example 1. In this regard, "temperature of TGA50%" may refer to a temperature of a sample when a weight of the sample is reduced by 50%. It may be interpreted to mean that the lower the TGA50% temperature, the higher the volatility of a compound.

TABLE 1

| | Type of compound | TGA50% temperature(° C.) | Melting point(° C.) |
|---|---|---|---|
| Comparative Example 1 | Compound represented by Chemical Formula 1-a | 264 | 45 |
| Comparative Example 2 | Compound represented by Chemical Formula 1-b | 282 | 260 |
| Present Example 1 | Compound represented by Chemical Formula 6 | 250 | Liquid |

Referring to Table 1, the compound of Present Example 1 has a lower TGA50% temperature than that of each of Comparative Example 1 and Comparative Example 2. That is, the compound of Present Example 1 may be interpreted as having higher volatility than that of each of Comparative Example 1 and Comparative Example 2. Further, the compound of Present Example 1 has a lower melting point than that of each of Comparative Example 1 and Comparative Example 2. The compound of Present Example 1 may be in a liquid state at room temperature. This may be interpreted to mean that the compound of Present Example 1 has higher thermal stability than that of each of Comparative Example 1 and Comparative Example 2.

Taken together, a compound for manufacturing the thin film that further includes the neutral ligand may be interpreted as having higher volatility and higher thermal stability than those of compounds for manufacturing the thin film that does not include the neutral ligand.

According to Present Example 1, the compound for manufacturing the thin film according to some embodiments may further increase process efficiency in a thin film deposition process than the compounds represented by each of Chemical Formula 1-a and Chemical Formula 1-b.

Comparative Example 3

A compound represented by a following Chemical Formula 1-c is subjected to thermogravimetric analysis (TGA) to measure a melting point of the compound represented by the following Chemical Formula 1-c. When comparing Chemical Formula 8 and Chemical Formula 1-c with each other, in the compound represented by Chemical Formula 1-c, $R_1$ and $R_2$ are symmetric with respect to each other, $R_4$ and $R_5$ are symmetric with respect to each other, and $R_3$ is hydrogen.

[Chemical Formula 1-c]

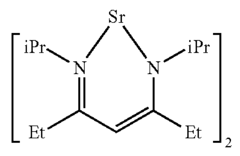

Present Example 2

A compound represented by a following Chemical Formula 9 is subjected to thermogravimetric analysis (TGA) to measure a melting point of the compound represented by the following Chemical Formula 9. When comparing Chemical Formula 8 and Chemical Formula 9 with each other, in the compound represented by Chemical Formula 9, $R_1$ and $R_2$ are asymmetric with respect to each other, $R_4$ and $R_5$ are symmetric with respect to each other, and $R_3$ is hydrogen.

[Chemical Formula 9]

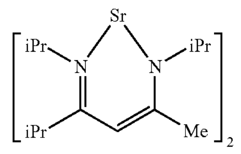

Present Example 3

A compound represented by a following Chemical Formula 10 is subjected to thermogravimetric analysis (TGA) to measure a melting point of the compound represented by the following Chemical Formula 1-d. When comparing Chemical Formula 8 and Chemical Formula 10 to each other, in the compound represented by Chemical Formula 10, $R_1$ and $R_2$ are symmetric with respect to each other, $R_4$ and $R_5$ are asymmetric with respect to each other, and $R_3$ is hydrogen.

[Chemical Formula 10]

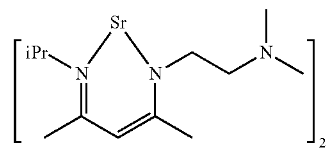

Table 2 shows results of measuring a temperature of TGA50% and a melting point of each of the compounds of Comparative Example 3, Present Example 2, and Present Example 3.

TABLE 2

| | Type of compound | TGA50% temperature(° C.) | Melting point(° C.) |
|---|---|---|---|
| Comparative Example 3 | Compound represented by Chemical Formula 1-c | 255 | 97 |
| Present Example 2 | Compound represented by Chemical Formula 9 | 251 | 60 |
| Present Example 3 | Compound represented by Chemical Formula 10 | 284 | 64 |

Referring to Table 2, the compound of Present Example 2 has a lower TGA50% temperature than that of Comparative Example 3. This may be interpreted to mean that the compound of Present Example 2 is more volatile than the compound of Comparative Example 3 is. Further, the compound of Present Example 2 has a lower melting point than that of Comparative Example 3. This may be interpreted to mean that the compound of Present Example 2 has higher thermal stability than that of Comparative Example 3.

When comparing the compounds of Chemical Formula 8, the Comparative Example 3 and Present Example 2 with each other, it may be interpreted to mean that a case in which $R_1$ and $R_2$ are asymmetric with respect to each other has higher volatility and higher thermal stability than those in a case in which $R_1$ and $R_2$ are symmetric with respect to each other.

Further, the compound of Present Example 3 has a lower melting point than that of Comparative Example 3. This may be interpreted to mean that the compound of Present Example 3 has higher thermal stability than that of Comparative Example 3.

When comparing the compounds of Chemical Formula 8, Present Example 3, and Comparative Example 3, a case in which $R_4$ and $R_5$ are asymmetric with respect to each other may be interpreted as having higher thermal stability than those in a case in which $R_4$ and $R_5$ are symmetric with respect to each other.

According to Present Example 2 and Present Example 3, the composition for manufacturing the thin film according to some embodiments may further increase the efficiency of the process in the thin film deposition process than the compounds represented by Chemical Formula 1-c.

Comparative Example 5

A compound represented by a following Chemical Formula 1-d is subjected to thermogravimetric analysis (TGA) to measure a melting point of the compound represented by the following Chemical Formula 1-d. The compound represented by Chemical Formula 1-d does not contain a neutral ligand that binds to barium (Ba).

[Chemical Formula 1-d]

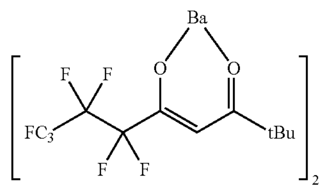

Present Example 4

A compound represented by a following Chemical Formula 7 is subjected to thermogravimetric analysis (TGA) to measure a melting point of the compound represented by the following Chemical Formula 7. The compound represented by Chemical Formula 7 contains a neutral ligand bonded to barium (Ba), and the neutral ligand is polyether.

[Chemical Formula 7]

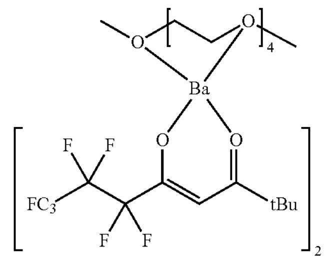

TABLE 3

| | Type of compound | TGA50% temperature(° C.) | Melting point(° C.) |
|---|---|---|---|
| Comparative Example 4 | Compound represented by Chemical Formula 1-d | 318 | 311 |
| Present Example 4 | Compound represented by Chemical Formula 7 | 289 | 44 |

Referring to Table 3, the compound of Present Example 4 has a lower TGA50% temperature than that of Comparative Example 4. This may be interpreted to mean that the compound of Present Example 4 is more volatile than the compound of Comparative Example 4. Further, the compound of Present Example 4 has a lower melting point than that of Comparative Example 4. This may be interpreted to mean that the compound of Present Example 4 has higher thermal stability than that of Comparative Example 4. Taken together, the composition for manufacturing the thin film that further contains the neutral ligand may be interpreted as having higher volatility and higher thermal stability than those of the composition for manufacturing the thin film that does not contain the neutral ligand.

According to Present Example 4, the composition for manufacturing the thin film according to some embodiments may further increase process efficiency in the thin film deposition process than the compound represented by Chemical Formula 1-e.

Hereinafter, with reference to FIG. 1 to FIG. 7, a method for manufacturing a semiconductor device using a composition for manufacturing a thin film according to some embodiments will be described.

Figure 2:
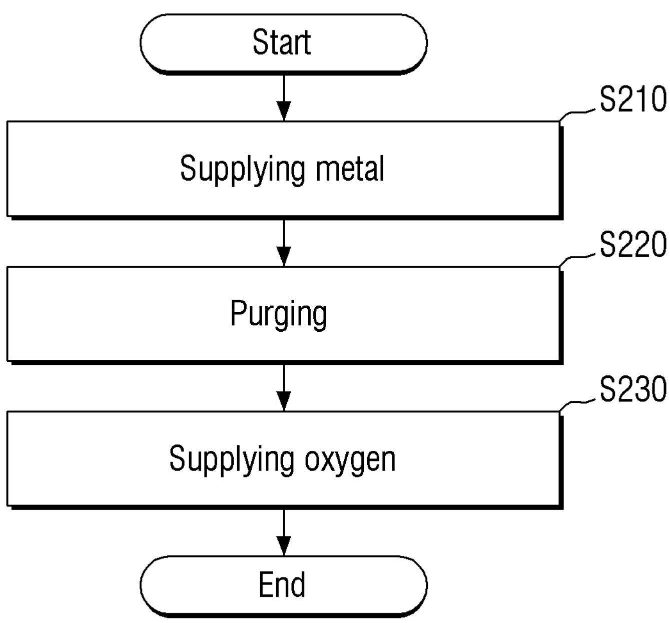

FIGS. 1 and 2 are flowcharts illustrating a method of manufacturing a thin film using a composition for manufacturing a thin film according to some embodiments.

Referring to FIG. 1 and FIG. 2, the thin film manufacturing method may include a first cycle and a second cycle. The first cycle may include supplying the composition for manufacturing the thin film (S110), purging (S120), and supplying oxygen (S130). The second cycle may include supplying a metal (S210), purging (S220), and supplying oxygen (S230).

A thin film may be formed by repeating the first cycle and the second cycle. The number of repetitions of the first cycle and the second cycle may be arbitrarily determined. In one example, each of the first cycle and the second cycle may be repeated 5 times. In another example, each of the first cycle and the second cycle may be repeated 10 times. In another example, the first cycle may be repeated 5 times, and the second cycle may be repeated 10 times. That is, the first cycle and the second cycle may be repeated the same number of times or may be repeated different numbers of times. However, the technical idea of the present disclosure is not limited thereto.

Supplying the composition for manufacturing the thin film (S110) may include supplying a gaseous composition for manufacturing a thin film into a chamber. For example, a composition for manufacturing a thin film may be supplied into the chamber using at least one of a gas transport method and a liquid transport method.

The gas transport method may include, for example, heating or depressurizing the composition for manufacturing the thin film to vaporize the same in a container in which the composition for manufacturing the thin film is stored, and supplying the vaporized composition to the chamber in which a substrate is disposed. The liquid transport method may include, for example, supplying the composition for manufacturing the thin film in a liquid state to a vaporization chamber, and vaporizing the same by heating or depressurizing the composition in the vaporization chamber to produce a vapor and supplying the vapor to the chamber in which a substrate is disposed.

As described above, the composition for manufacturing the thin film may include the compound represented by the following Chemical Formula 1:

[Chemical Formula 1]

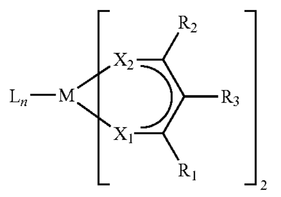

M may be strontium (Sr) or barium (Ba), $X_1$ and $X_2$ may each independently be oxygen (O) or a substituted or unsubstituted alkylamino group having 1 to 5 carbon atoms, $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, L may be a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n may be an integer of 1 to 6 (i.e., 1, 2, 3, 4, 5 or 6).

The metal may include, but is not limited to, titanium (Ti). The thin film manufactured by repeatedly performing the first cycle and the second cycle may include, for example, at least one of $SrTiO_3$, $BaTiO_3$, or $SrBaTi_2O_6$.

FIG. 3 to FIG. 7 are diagrams of intermediate structures illustrating a method for manufacturing a capacitor dielectric film using a composition for manufacturing a thin film according to some embodiments. Although a DRAM is illustrated as the semiconductor device by way of example in some embodiments, this is only for convenience of illustration. The disclosure is not limited thereto.

Figure 3:
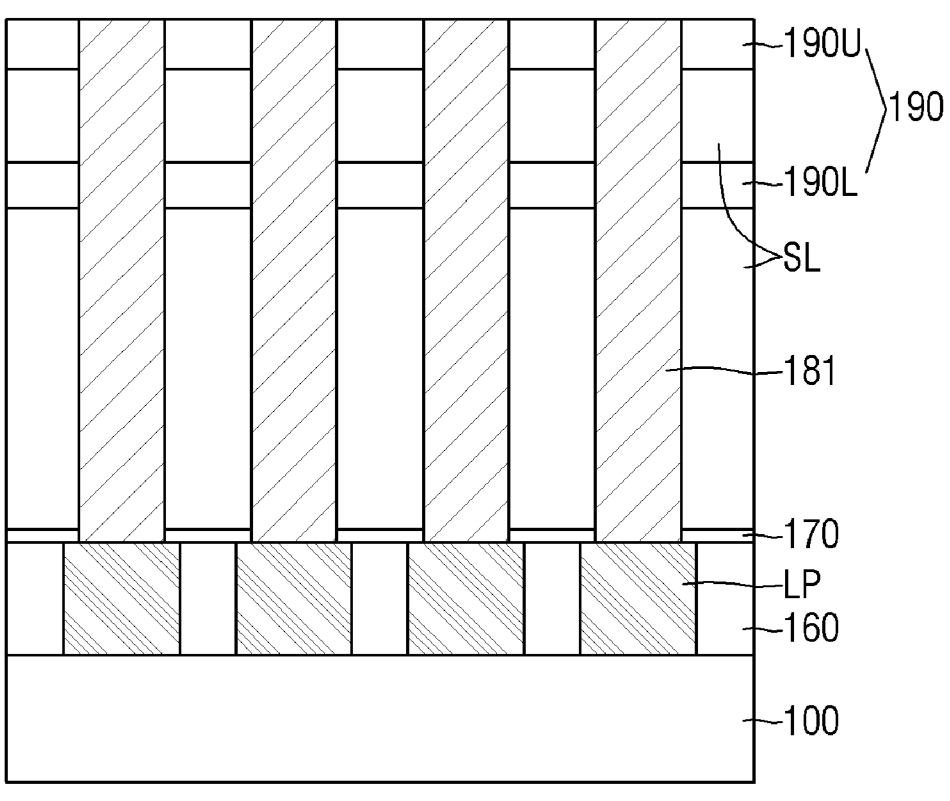
FIG. 3 to FIG. 7 are diagrams of intermediate structures illustrating a method for manufacturing a capacitor dielectric film using a composition for manufacturing a thin film according to some embodiments of the present invention.

Referring to FIG. 3, a substrate 100 may be provided. The substrate 100 may be made of bulk silicon or (SOI) silicon-on-insulator. In some embodiments, the substrate 100 may be embodied as a silicon substrate, or may be made of a material other than silicon, for example, silicon germanium, SGOI (silicon germanium on insulator), indium antimonide, lead telluride compound, indium arsenide, indium phosphide, gallium arsenide or gallium antimonide. However, the present disclosure is not limited thereto. In following description, an example in which the substrate 100 is embodied as the silicon substrate is described.

In some embodiments, the substrate 100 may include an active region. Although not shown, an element isolation film may be formed in the substrate 100. Then active region may be defined by the element isolation film.

A landing pad LP may be formed on the substrate 100. The landing pad LP may be connected to the active region within the substrate 100. The landing pad LP may include a conductive material. For example, the landing pad LP may include tungsten (W). However, the technical idea of the present disclosure is not limited thereto.

The landing pads LP may be isolated from each other via a pad isolation insulating film 160. The pad isolation insulating film 160 may define an area of the landing pad LP as each of a plurality of isolated areas. Further, the pad isolation insulating film 160 may not cover a top face of the landing pad LP. The pad isolation insulating film 160 may include an insulating material. For example, the pad isolation insulating film 160 may include, for example, at least one of a silicon oxide film, a silicon nitride film, a silicon oxynitride film, a silicon oxycarbonitride film, and a silicon carbonitride film.

An etch stop film 170 may be formed on the landing pad LP. Subsequently, on the etch stop film 170, a sacrificial film SL and a sacrificial support film (not shown) may be sequentially stacked. The sacrificial support film may include an upper sacrificial support film and a lower sacrificial support film. The lower sacrificial support film may be interposed between vertically adjacent portions of the sacrificial film SL.

Subsequently, a trench may be formed by etching a portion of each of the sacrificial film SL, the sacrificial support film, and the etch stop film 170. A vertical support film 190 may be formed by removing a portion of the sacrificial support film. The vertical support film 190 may include a lower support film 190L and an upper support film 190U. The lower support film 190L may be interposed between vertically adjacent portions of the sacrificial film SL. A top face of the upper support film 190U may be coplanar with a top face of the lower electrode 181.

The vertical support layer 190 may include, for example, at least one of silicon nitride (SiN), silicon carbide nitride (SiCN), silicon boron nitride (SiBN), silicon carbide (SiCO), silicon oxynitride (SiON), and silicon oxynitride (SiOCN). However, the technical idea of the present disclosure is not limited thereto.

A lower electrode 181 may be formed in the trench. The lower electrode 181 may be connected to the landing pad LP. The lower electrode 181 may be connected to the active region within the substrate 100 via the landing pad LP. The lower electrode 181 may include a conductive material. For example, the lower electrode 181 may include a doped semiconductor material, a conductive metal nitride such as titanium nitride, tantalum nitride, niobium nitride or tungsten nitride, a metal such as ruthenium, iridium, titanium or tantalum, and the like, a conductive metal oxide such as iridium oxide or niobium oxide. However, the disclosure is not limited thereto.

Figure 4:
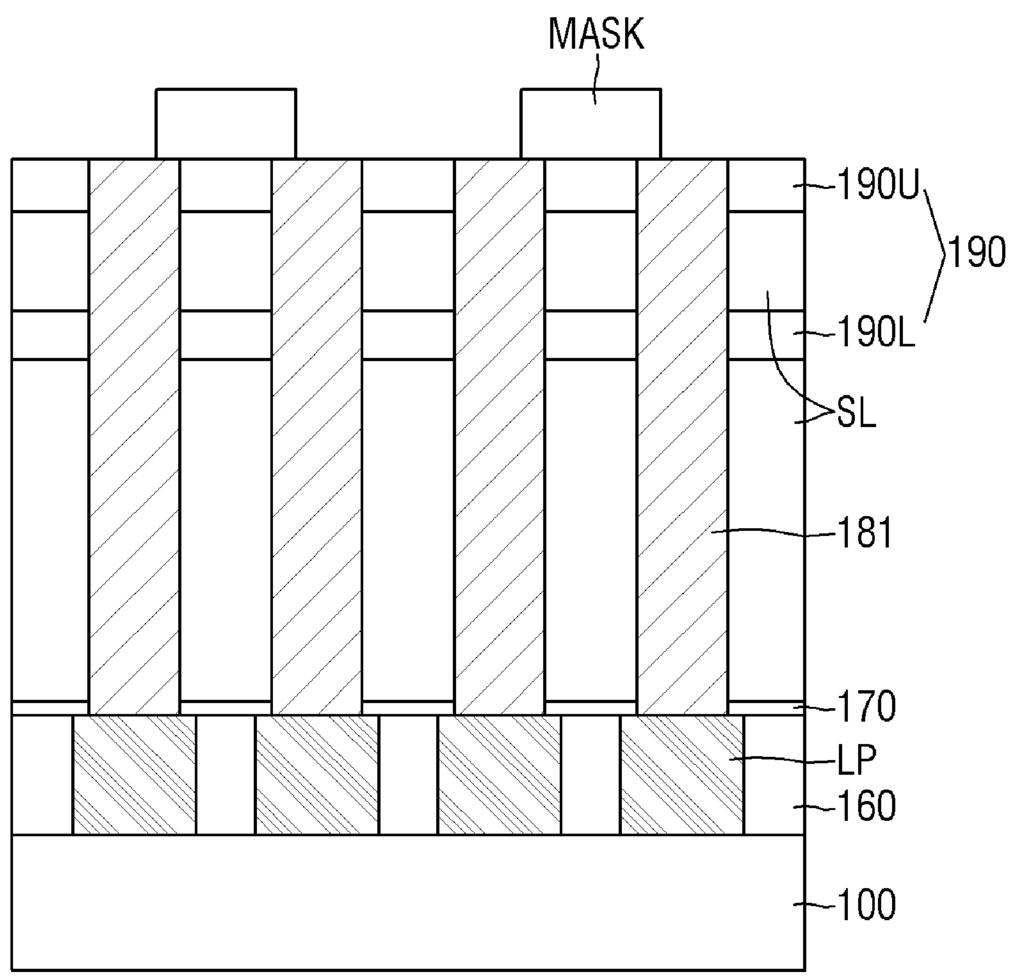

Referring to FIG. 4, a mask layer MASK may be formed on the lower electrode 181. The mask layer MASK may cover a portion of the upper support layer 190U. That is, a portion of the upper supporting layer 190U may be covered with the mask layer MASK, while the other portion of the upper supporting layer 190U may be exposed.

The mask layer MASK may be composed of, for example, at least one of a photoresist layer, an ACL (amorphous carbon layer), an SOH (spin on hardmask), an SOC (spin on carbon) layer, and a silicon nitride layer.

Figure 5:
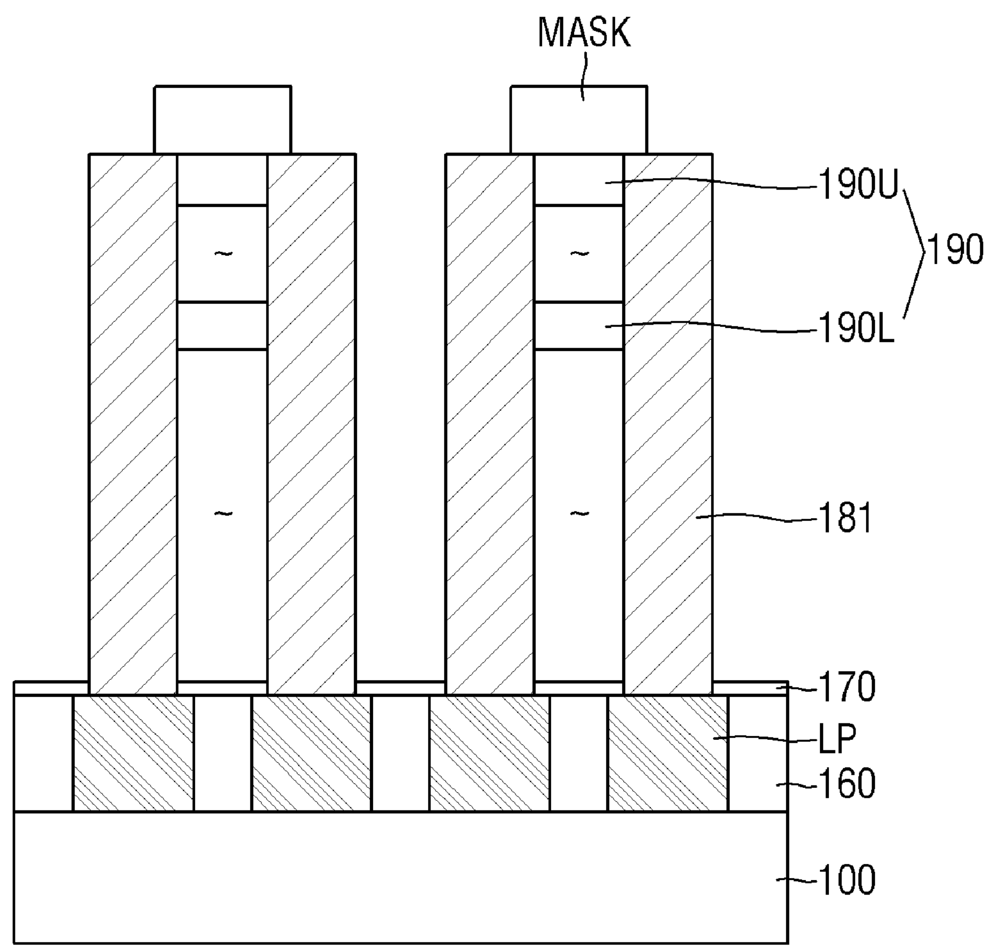

Referring to FIG. 5, the sacrificial film SL may be removed by using the mask film MASK as an etching mask. In the process of removing the sacrificial film SL, portions of the vertical supporting film 190 not covered with the mask film MASK may be removed as shown in FIG. 5.

Figure 6:
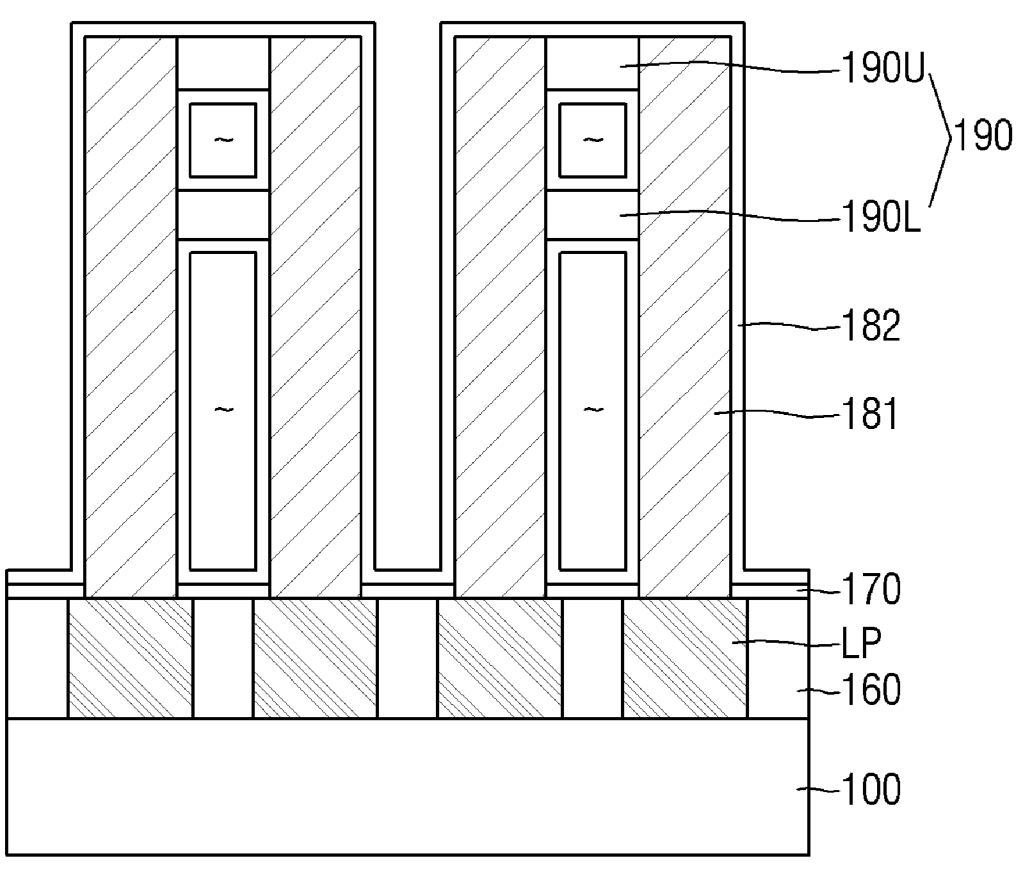

Referring to FIG. 6, a capacitor dielectric film 182 may be formed along a profile of the lower electrode 181. Forming the capacitor dielectric film 182 may include a method for manufacturing the thin film as described with reference to FIG. 1 and FIG. 2. The capacitor dielectric film 182 may have a uniform thickness along a surface of the lower electrode 181, as illustrated in For example, referring to FIG. 1 and FIG. 6, a composition for manufacturing a thin film represented by a following Chemical Formula 1 is supplied (S110).

[Chemical Formula 1]

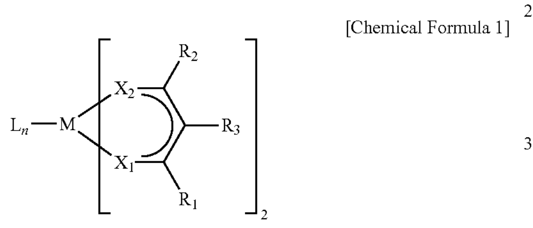

M may be strontium (Sr) or barium (Ba), $X_1$ and $X_2$ may each independently be oxygen (O) or a substituted or unsubstituted alkylamino group having 1 to 5 carbon atoms, $R_1$ and $R_2$ may each independently be a substituted or unsubstituted alkyl group having 1 to 5 carbon atoms or a substituted or unsubstituted perfluoro alkyl group having 1 to 5 carbon atoms, $R_3$ may be hydrogen or a substituted or unsubstituted alkyl group having 1 to 5 carbon atoms, L may be a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n may be an integer between 1 and 6.

Then, the composition for manufacturing the thin film is purged (S120). The composition for manufacturing the thin film may be provided in a gaseous state. The method may purge the provided gaseous composition for manufacturing the thin film. Then, oxygen is supplied (S130). Supplying the oxygen may include, but is not limited to, at least one of supplying $O_2$ or supplying $O_3$.

Referring to FIG. 2 and FIG. 6, the method may include supplying a metal (S210). The metal may include, for example, titanium (Ti). However, the present disclosure is not limited thereto.

Subsequently, the metal may be purged (S220). Subsequently, oxygen may be supplied (S230). Supplying the oxygen may include at least one of supplying $O_2$ or supplying $O_3$. However, the present disclosure is not limited thereto.

The capacitor dielectric film 182 formed using the manufacturing method may include at least one of $SrTiO_3$, $BaTiO_3$, and $SrBaTi_2O_6$. However, the present disclosure is not limited thereto.

Figure 7:
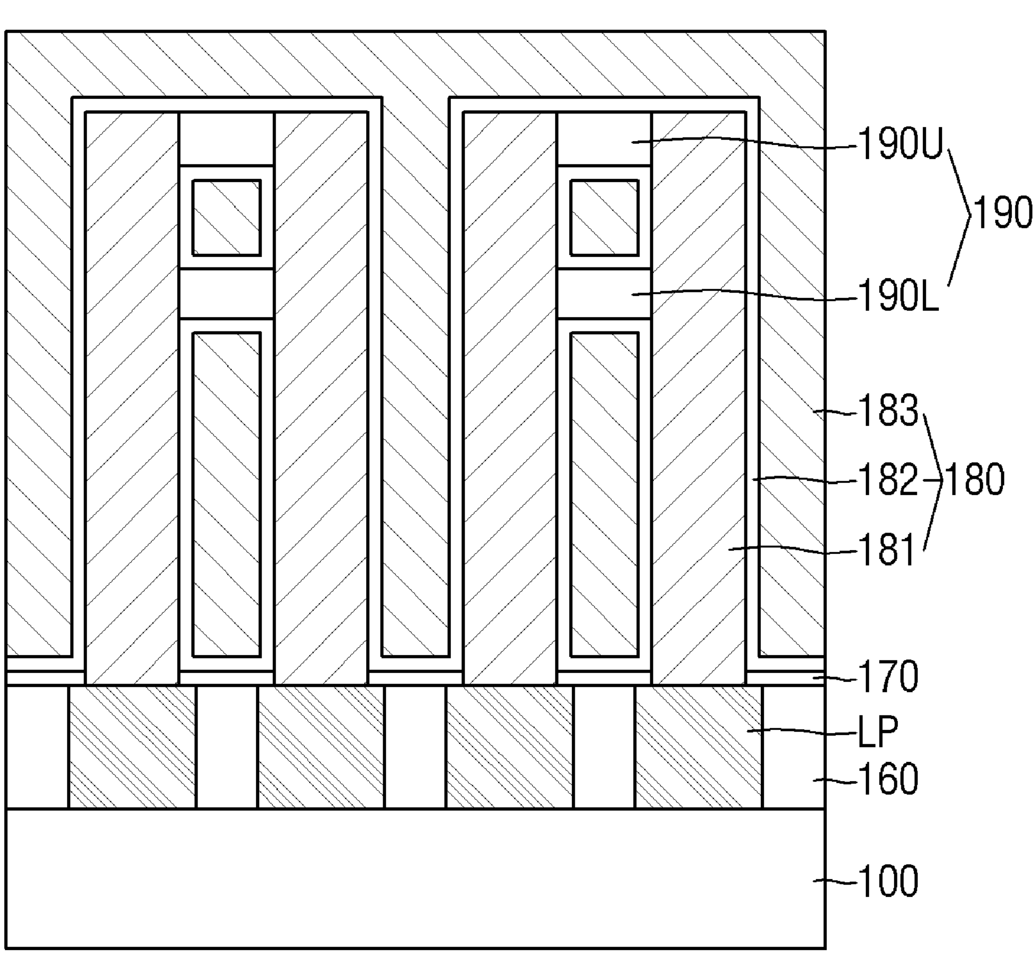

Referring to FIG. 7, an upper electrode 183 may be formed on the capacitor dielectric film 182.

The upper electrode 183 is formed. Thus, the capacitor 180 may be formed. The capacitor 180 may include the lower electrode 181, the capacitor dielectric film 182, and the upper electrode 183. The upper electrode 183 may cover an entirety of each of the capacitor dielectric film 182 and the lower electrode 181. The upper electrode 183 may include a conductive material. The upper electrode 183 may include, for example, a doped semiconductor material, a conductive metal nitride such as titanium nitride, tantalum nitride, niobium nitride or tungsten nitride, a metal such as ruthenium, iridium, titanium or tantalum, and the like, or a conductive metal oxide such as iridium oxide or niobium oxide. However, the present disclosure is not limited thereto.

Figure 8:
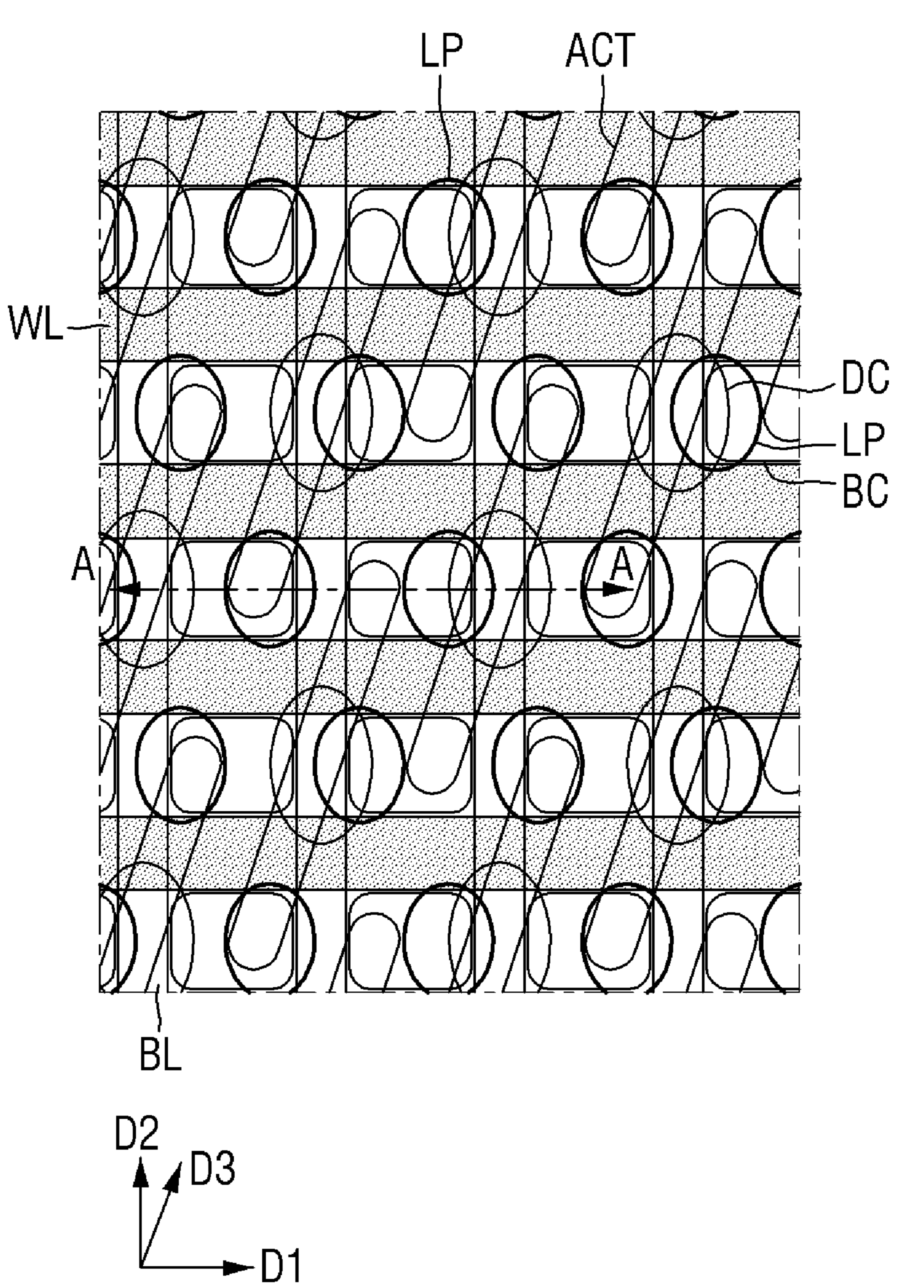
FIG. 8 is an illustrative plan view of a semiconductor device manufactured using a composition for manufacturing a thin film according to some embodiments of the present invention.
Figure 9:
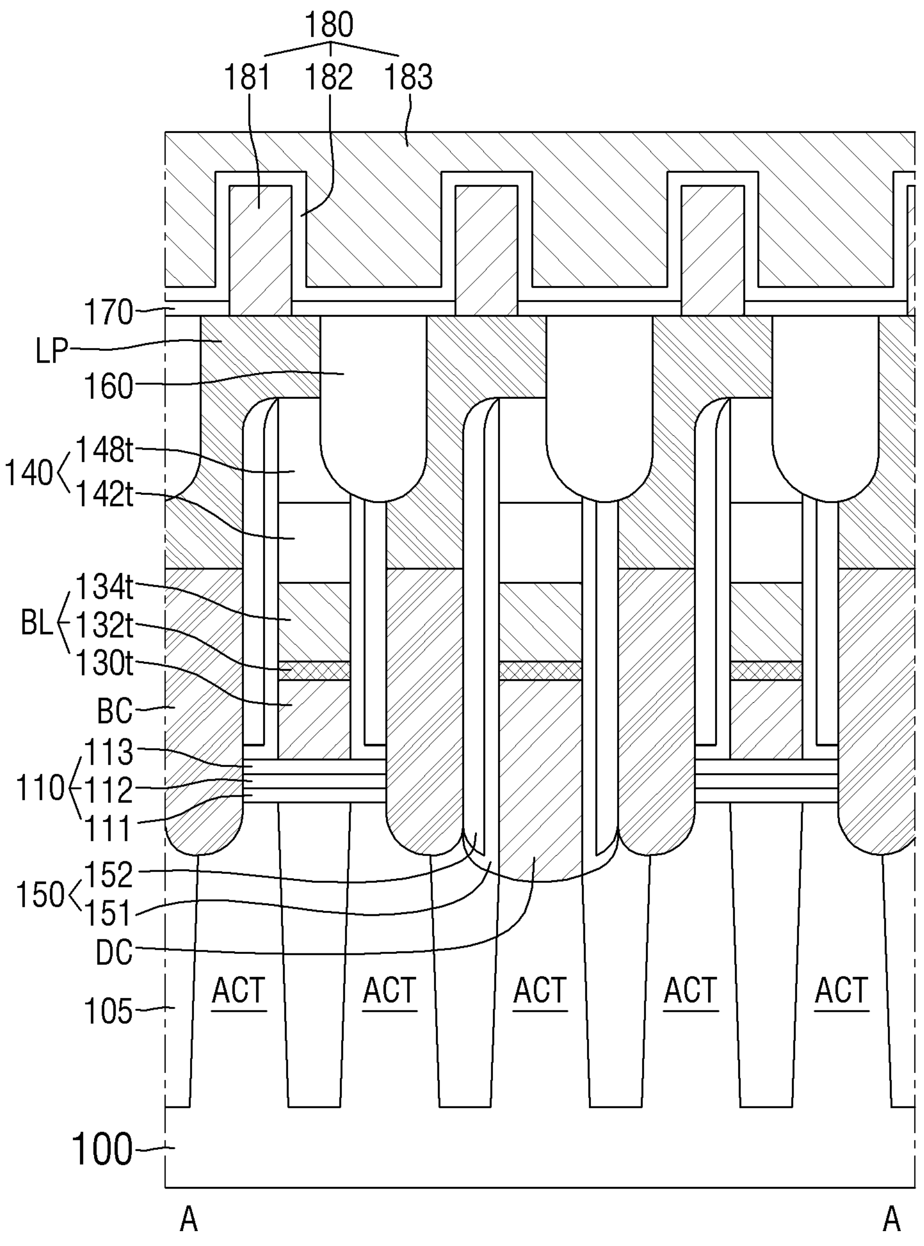
FIG. 9 is a cross-sectional view taken along a line A-A of FIG. 8.

FIG. 8 is an illustrative plan view of a semiconductor device manufactured using a composition for manufacturing a thin film according to some embodiments. FIG. 9 is a cross-sectional view taken along a line A-A of FIG. 8. Hereinafter, a semiconductor device according to some embodiments will be described with reference to FIG. 8 and FIG. 9.

Referring to FIG. 8 and FIG. 9, the substrate 100 is provided. A cell element isolation film 105 may be disposed within the substrate 100. The cell element isolation film 105 may define an active region ACT. As a design rule of the semiconductor device is reduced, the active region ACT may extend in a form of a bar of an oblique line or an oblique line as shown. For example, the active region ACT may extend in a third direction D3.

The active regions ACT may be arranged in the first direction D1 and may be parallel to each other. An end of one active region ACT may be adjacent to a center of another neighboring active region ACT. In this regard, the first direction D1 and the second direction D2 may be perpendicular to each other. The third direction D3 may be any direction between the first direction D1 and the second direction D2.

The substrate 100 may be embodied as a silicon polycrystalline substrate or an SOI substrate. The cell element isolation film 105 may include an oxide liner, a nitride liner, and a buried insulating film.

The semiconductor device according to some embodiments may include various contact arrangements formed on the active region ACT. The various contact arrangements may include, for example, a direct contact DC, a buried contact BC, and the landing pad LP, etc.

In this regard, the direct contact DC may mean a contact that electrically connects the active region ACT to a bit-line BL. The buried contact BC may mean a contact connecting the active region ACT to the lower electrode 181. In terms of an arrangement structure, a contact area between the buried contact BC and the active region ACT may be small. Accordingly, the conductive landing pad LP may be introduced to increase the contact area with the lower electrode 181 as well as increase the contact area with the active region ACT.

The landing pad LP may be disposed between the active region ACT and the buried contact BC, or between the buried contact BC and the lower electrode 181. In the semiconductor device according to some embodiments, the landing pad LP may be disposed between the buried contact BC and the lower electrode 181. Increasing the contact area via the introduction of the landing pad LP may allow a contact resistance between the active region ACT and the lower electrode 181 to be reduced.

Word-lines WL may be embedded in the substrate 100. The word-lines WL may intersect the active region ACT. The word-lines WL may extend in the first direction D1. The word-lines WL may be spaced apart from each other in the second direction D2. The word-lines WL may be embedded in the substrate 100 and extend in the first direction D1. Although not shown, a doped area may be formed in a portion of the active region ACT between the word-lines WL. The doped area may be doped with an N-type impurity.

On the substrate 100, a buffer film 110 may be disposed. The buffer film 110 may include a first cell insulating film 111, a second cell insulating film 112, and a third cell insulating film 113 that are sequentially stacked. The second cell insulating film 112 may include a material having an etch selectivity with respect to each of the first cell insulating film 111 and the third cell insulating film 113. For example, the second cell insulating film 112 may include silicon nitride. Each of the first and third cell insulating films 111 and 113 may include silicon oxide.

Bit-lines BL may be disposed on the buffer layer 110. The bit-lines BL may extend across the substrate 100 and may intersect the word-lines WL. As shown in FIG. 8, the bit-lines BL may extend in the second direction D2. The bit-lines BL may be spaced apart from each other in the first direction D1.

Each of the bit-lines BL may include a bit-line lower electrode 130*t*, a bit-line middle electrode 132*t*, and a bit-line upper electrode 134*t* that are sequentially stacked. The bit-line lower electrode 130*t* may include impurity doped polysilicon. The bit-line middle electrode 132*t* may include TiSiN. The bit-line upper electrode 134*t* may include tungsten (W). However, the technical idea of the present disclosure is not limited thereto.

A bit-line capping pattern 140 may be disposed on the bit-line BL. The bit-line capping pattern 140 may include a first bit-line capping pattern 142*t* and a second bit-line capping pattern 148*t* sequentially stacked. Each of the first bit-line capping pattern 142*t* and the second bit-line capping pattern 148*t* may include silicon nitride.

A bit-line spacer 150 may be disposed on a sidewall of the bit-line BL and a sidewall of the bit-line capping pattern 140. The bit-line spacer 150 may be disposed on the substrate 100 and the cell element isolation film 105 and in an area of the bit-line BL in which the direct contact DC is formed. However, in an area where the direct contact DC is not formed, the bit-line spacer 150 may be disposed on the buffer layer 110.

The bit-line spacer 150 may be a single layer. However, as illustrated, the bit-line spacer 150 may be a multi-layer including first and second bit-line spacers 151 and 152. For example, each of the first and second bit-line spacers 151 and 152 may include one of a silicon oxide film, a silicon nitride film, a silicon oxynitride film (SiON), a silicon oxycarbonitride film (SiOCN), air, and a combination thereof. However, the disclosure is not limited thereto.

The buffer film 110 may be interposed between the bit-line BL and the cell element isolation film 105 and between the bit-line spacer 150 and the substrate 100.

The bit-line BL may be electrically connected to the doped area of the active region ACT via the direct contact DC. The direct contact DC may be made of, for example, polysilicon doped with impurity.

The buried contact BC may be disposed between a pair of adjacent bit-lines BL. The buried contact BCs may be spaced apart from each other. The buried contact BC may include at least one of impurity-doped polysilicon, conductive silicide compound, conductive metal nitride, and metal. The buried contact BC may have an island shape that is isolated from an adjacent one in a plan view. The buried contact BC may extend through the buffer film 110 and come into contact with the doped area of the active region ACT.

On the buried contact BC, the landing pad LP may be formed. The landing pad LP may be electrically connected to the buried contact BC. The landing pad LP may overlap a portion of a top face of the bit-line BL. The landing pad LP may include, for example, at least one of a semiconductor material doped with impurity, a conductive silicide compound, a conductive metal nitride, a conductive metal carbide, a metal, and a metal alloy.

The pad isolation insulating film 160 may be formed on the landing pad LP and the bit-line BL. For example, the pad isolation insulating film 160 may be disposed on the bit-line capping pattern 140. The pad isolation insulating film 160 may define an area of the landing pad LP as each of a plurality of isolated areas. Further, the pad isolation insulating film 160 may not cover a top face of the landing pad LP.

The pad isolation insulating film 160 may include an insulating material to electrically isolate the plurality of landing pads LP from each other. For example, the pad isolation insulating film 160 may include, for example, at least one of a silicon oxide film, a silicon nitride film, a silicon oxynitride film, a silicon oxycarbonitride film, and a silicon carbonitride film.

The etch stop film 170 may be disposed on the pad isolation insulating film 160 and the landing pad LP. The etch stop film 170 may include at least one of a silicon nitride film, a silicon carbonitride film, a silicon boron nitride film (SiBN), a silicon oxynitride film, and a silicon oxycarbide film.

The capacitor 180 may be disposed on the landing pad LP. The capacitor 180 may be electrically connected to the landing pad LP. A portion of the capacitor 180 may be disposed in the etch stop film 170. The capacitor 180 includes the lower electrode 181, the capacitor dielectric film 182, and the upper electrode 183.

The lower electrode 181 may be disposed on the landing pad LP. The lower electrode 181 is illustrated as having a pillar shape. However, the present disclosure is not limited thereto. In another example, the lower electrode 181 may have a cylindrical shape. The capacitor dielectric film 182 is formed on the lower electrode 181. The capacitor dielectric film 182 may be formed along the profile of the lower electrode 181. The capacitor dielectric film 182 may be formed using the composition for manufacturing the thin film according to some embodiments, as descried above. The upper electrode 183 is formed on the capacitor dielectric film 182. The upper electrode 183 may surround an outer sidewall of the lower electrode 181.

Each of the lower electrode 181 and the upper electrode 183 may include, for example, at least one of a doped semiconductor material, a conductive metal nitride (e.g., titanium nitride, tantalum nitride, niobium nitride, or tungsten nitride, etc.), a metal (e.g., ruthenium, iridium, titanium or tantalum, and the like), and a conductive metal oxide (e.g., iridium oxide or niobium oxide, and the like). However, the present disclosure is not limited thereto.

The capacitor dielectric film 182 may include one of, for example, silicon oxide, silicon nitride, silicon oxynitride, and a high dielectric constant material, and combinations thereof. However, the present disclosure is not limited thereto. In the semiconductor device according to some embodiments, the capacitor dielectric film 182 may include a stacked film structure in which a zirconium oxide film, an aluminum oxide film, and a zirconium oxide film are sequentially stacked. In the semiconductor device according to some embodiments, the capacitor dielectric film 182 may include a dielectric film including hafnium (Hf). In the semiconductor device according to some embodiments, the capacitor dielectric film 182 may have a stack structure of a ferroelectric material film and a paraelectric material film.

Figure 11:
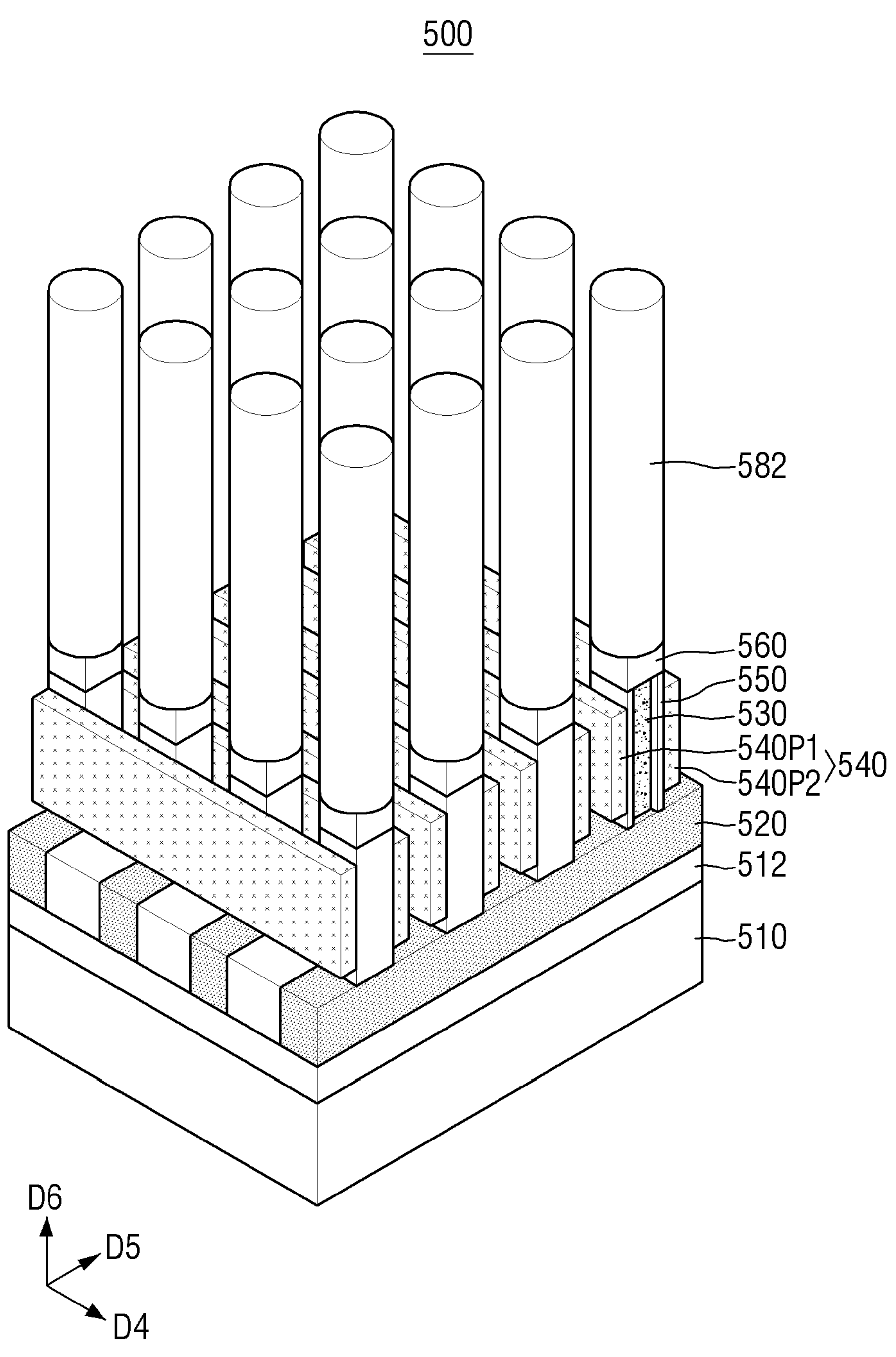
FIG. 11 is a perspective view illustrating a semiconductor device according to some embodiments of the present invention.

When forming the capacitor dielectric film 182 using the composition for manufacturing the thin film according to some embodiments, the capacitor dielectric film 182 may include at least one of $SrTiO_3$, $BaTiO_3$, and $SrBaTi_2O_6$. However, the present disclosure is not limited thereto. In FIG. 11, several elements of FIG. 12 (e.g., second insulating patterns 532 and an upper electrode 586) are omitted from view for simplicity of illustration.

Figure 10:
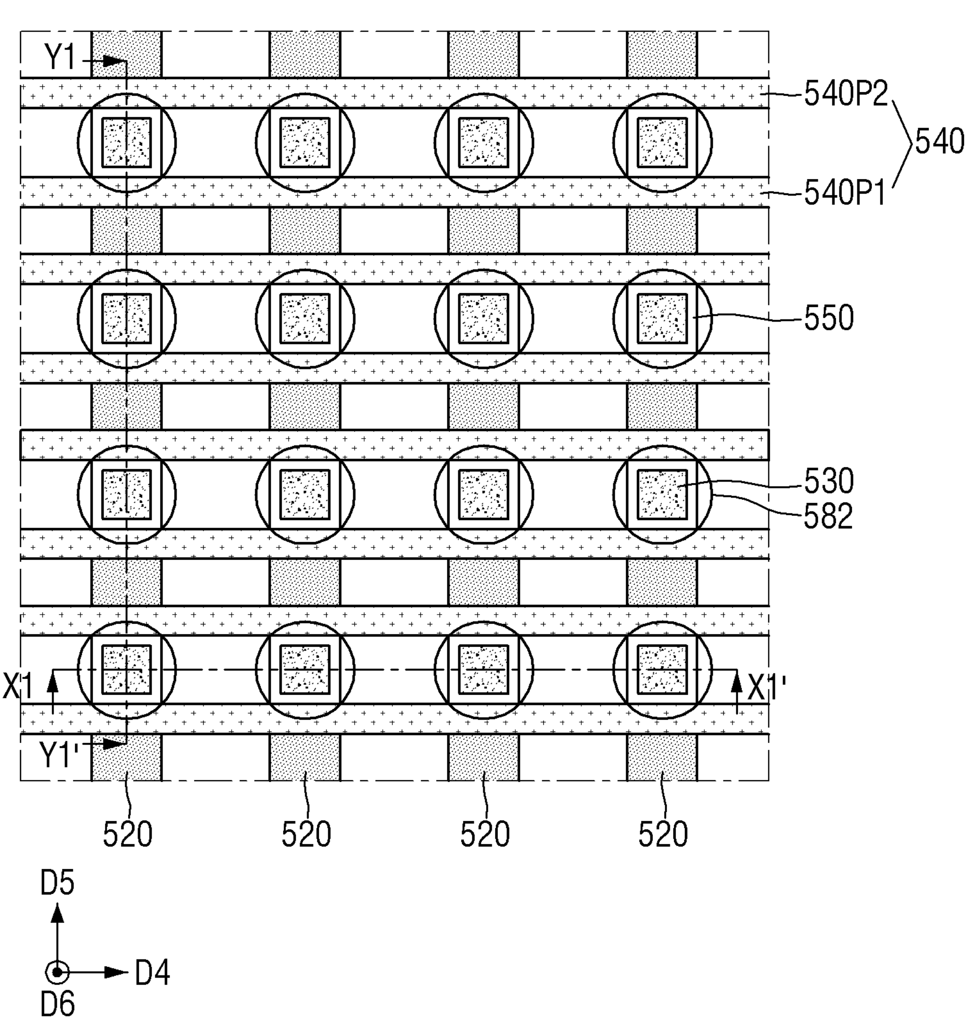
FIG. 10 is a layout diagram illustrating a semiconductor device according to some embodiments of the present invention.
Figure 12:
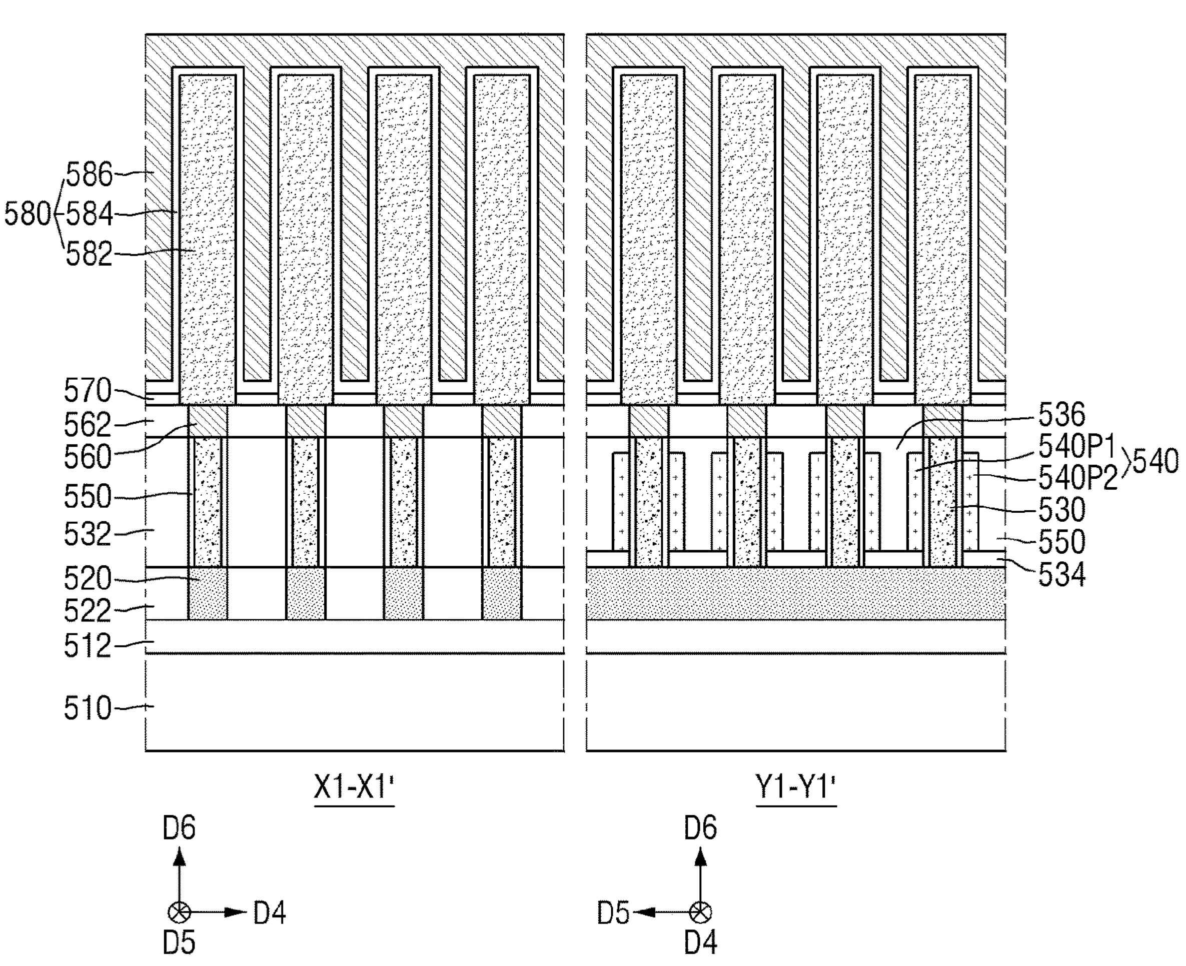
FIG. 12 is a cross-sectional view taken along X1-X1' and Y1-Y1' in FIG. 10.

FIG. 10 is a layout diagram for illustrating a semiconductor device according to some embodiments. FIG. 11 is a perspective view for illustrating a semiconductor device according to some embodiments. FIG. 12 is a cross-sectional view taken along X1-X1' and Y1-Y1' in FIG. 10.

Referring to FIG. 10 to FIG. 12, a semiconductor device 500 may include a substrate 510, a plurality of first conductive lines 520, a channel layer 530, a gate electrode 540, a gate insulating layer 550, and a capacitor structure 580. The semiconductor device 500 may be embodied as a memory device including a vertical channel transistor (VCT). The vertical channel transistor may refer to a structure in which a channel length of the channel layer 530 extends from the substrate 510 along a vertical direction. The capacitor structure 580 in FIG. 10 to FIG. 12 may be the same as the capacitor 180 described using FIG. 3 to FIG. 7.

A lower insulating layer 512 may be disposed on the substrate 510, and a plurality of first conductive lines 520 spaced apart from each other in a fourth direction D4 and extending in a fifth direction D5 may be formed on the lower insulating layer 512. Each of a plurality of first insulating patterns 522 may be disposed on the lower insulating layer 512 so as to fill each space between adjacent ones of the plurality of first conductive lines 520. The plurality of first insulating pattern 522 may extend in a fifth direction D5, and a top face of each of the plurality of first insulating pattern 522 may be disposed at the same level as that of a top face of each of the plurality of first conductive lines 520. Each of the plurality of first conductive lines 520 may function as a bit-line of the semiconductor device 500.

In some embodiments, each of the plurality of first conductive lines 520 may include doped polysilicon, metal, conductive metal nitride, conductive metal silicide, conductive metal oxide, or a combination thereof. For example, each of the plurality of first conductive lines 520 may be made of at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. However, the present disclosure is not limited thereto. Each of the plurality of first conductive lines 520 may include a single layer or multiple layers made of the aforementioned materials. In some embodiments, each of the plurality of first conductive lines 520 may include a two-dimensional semiconductor material. In one example, the two-dimensional semiconductor material may include graphene, carbon nanotube, or a combination thereof.

The channel layer 530 may include a plurality of channels which may be respectively formed on the plurality of first conductive lines 520 and may be spaced apart from each other in the fourth direction D4 and the fifth direction D5 and thus may be arranged in a matrix form. Each of the channels of the channel layer 530 may have a first width in the fourth direction D4 and a first vertical dimension in a sixth direction D6, and the first vertical dimension may be larger than the first width. For example, the first vertical dimension may be about 2 to 10 times the first width. However, the present disclosure is not limited thereto. A bottom portion of each channel of the channel layer 530 may function as a first source/drain area (not shown), and a top portion of each channel of the channel layer 530 may function as a second source/drain area (not shown), while a portion of each channel of the channel layer 530 between the first and second source/drain areas may function as a channel area (not shown).

In some embodiments, the channel layer 530 may include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$ or combinations of thereof. The channel layer 530 may include a single layer or multiple layers made of the oxide semiconductor. In some embodiments, the channel layer 530 may have a bandgap energy greater than a bandgap energy of silicon. For example, the channel layer 530 may have a bandgap energy of about 1.5 eV to 5.6 eV. For example, the channel layer 530 may have optimal channel performance when the layer 530 has a bandgap energy of about 2.0 eV to 4.0 eV. For example, the channel layer 530 may be made of polycrystalline or amorphous. However, the present disclosure is not limited thereto. In some embodiments, the channel layer 530 may include a two-dimensional semiconductor material. For example, the two-dimensional semiconductor material may include graphene, carbon nanotube, or a combination thereof.

The gate electrode 540 may extend in the fourth direction D4 and may be formed on both opposing sidewalls of the channel layer 530. The gate electrode 540 may include a first sub-gate electrode 540P1 facing a first sidewall of the channel layer 530, and a second sub-gate electrode 540P2 facing a second sidewall opposite to the first sidewall of the channel layer 530. As one channel of the channel layer 530 is disposed between the first sub-gate electrode 540P1 and the second sub-gate electrode 540P2, the semiconductor device 500 may have a dual gate transistor structure. However, the technical idea of the present disclosure is not limited thereto. In another example, the second sub-gate electrode 540P2 may be omitted and only the first sub-gate electrode 540P1 facing the first sidewall of the channel layer 530 may be formed, thereby implementing a single gate transistor structure.

The gate electrode 540 may include doped polysilicon, metal, conductive metal nitride, conductive metal silicide, conductive metal oxide, or a combination thereof. For example, the gate electrode 540 may be made of at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof. However, the present disclosure is not limited thereto.

The gate insulating layer 550 may surround a sidewall of each channel of the channel layer 530 and may be interposed between each channel of the channel layer 530 and the gate electrode 540. For example, as shown in FIG. 12, an entirety of a sidewall of each channel of the channel layer 530 may be surrounded with the gate insulating layer 550, and a portion of a sidewall of the gate electrode 540 may contact the gate insulating layer 550. In another example, the gate insulating layer 550 may extend in the extension direction of the gate electrode 540, that is, in the fourth direction D4, and only two sidewalls facing the gate electrode 540 among the sidewalls of the channel layer 530 may be in contact with the gate insulating layer 550.

In some embodiments, the gate insulating layer 550 may include a silicon oxide film, a silicon oxynitride film, a high dielectric film having a higher dielectric constant than that of a silicon oxide film, or a combination thereof. The high dielectric film may be made of metal oxide or metal oxide nitride. For example, the high dielectric film constituting the gate insulating layer 550 may be made of $HfO_2$, HfSiO, HfSiON, HfTaO, HfSiO, HfZrO, $ZrO_2$, $Al_2O_3$, or a combination thereof. However, the present disclosure is not limited thereto.

A plurality of second insulating patterns 532 may be respective formed on the plurality of first insulating patterns 522 and may extend along the fifth direction D5. Each channel of the channel layer 530 may be disposed between adjacent two second insulating patterns 532 of the plurality of second insulating patterns 532. Further, a first buried layer 534 and a second buried layer 536 may be disposed in a space between two adjacent channels of the channel layer 530 and between two adjacent second insulating patterns 532. The first buried layer 534 may be disposed at a bottom of the space between two adjacent channels of the channel layer 530, and the second buried layer 536 may be formed on the first buried layer 534 so as to fill the remainder of the space between the two adjacent channels of the channel layer 530. A top face of the second buried layer 536 may be disposed at the same level as that of a top face of the channel layer 530, and the second buried layer 536 may cover a top face of the gate electrode 540. Alternatively, the plurality of second insulating patterns 532 and the plurality of first insulating patterns 522 may be continuously monolithic. Alternatively, the second buried layer 536 and the first buried layer 534 may be continuously monolithic.

The capacitor contact layer 560 may be disposed on the channel layer 530. Each of the capacitor contact layers 560 may vertically overlap with each channel of the channel layer 530. The capacitor contact layers 560 may be spaced apart from each other in the fourth direction D4 and the fifth direction D5 and thus may be arranged in a matrix form. The capacitor contact layer 560 may be made of at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof. However, the present disclosure is not limited thereto. An upper insulating layer 562 may surround a sidewall of each capacitor contact of the capacitor contact layer 560 and may be disposed on the plurality of second insulating patterns 532 and the second buried layer 536.

The etch stop film 570 may be disposed on the upper insulating layer 562. The capacitor structure 580 may be disposed on the etch stop film 570. The capacitor structure 580 may include a storage electrode layer 582, a capacitor dielectric film 584, and an upper electrode 586.

Each of the storage electrode layers 582 may extend through the etch stop film 570 and be electrically connected to a top face of the capacitor contact layer 560. The storage electrode layer 582 may be formed in a pillar type extending in the sixth direction D6. However, the present disclosure is not limited thereto. In some embodiments, the storage electrode layer 582 may vertically overlap the capacitor contact layer 560. The storage electrode layer 582 may be spaced apart from each other in the fourth direction D4 and the fifth direction D5 and may be arranged in a matrix form. Alternatively, the landing pad (not shown) may be further disposed between the capacitor contact layer 560 and the storage electrode layer 582 so that the storage electrode layer 582 may be arranged in a hexagonal manner.

Figure 13:
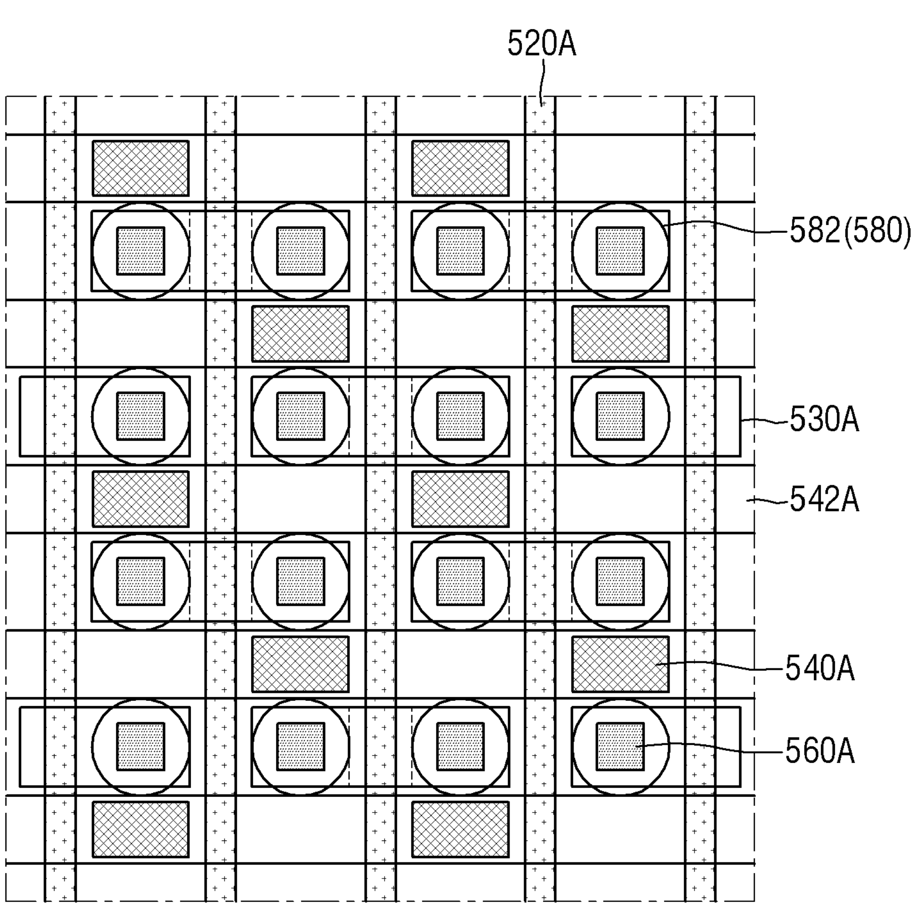
FIG. 13 is a layout diagram illustrating a semiconductor device according to some embodiments of the present invention.
Figure 13:
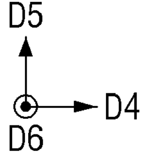
Figure 14:
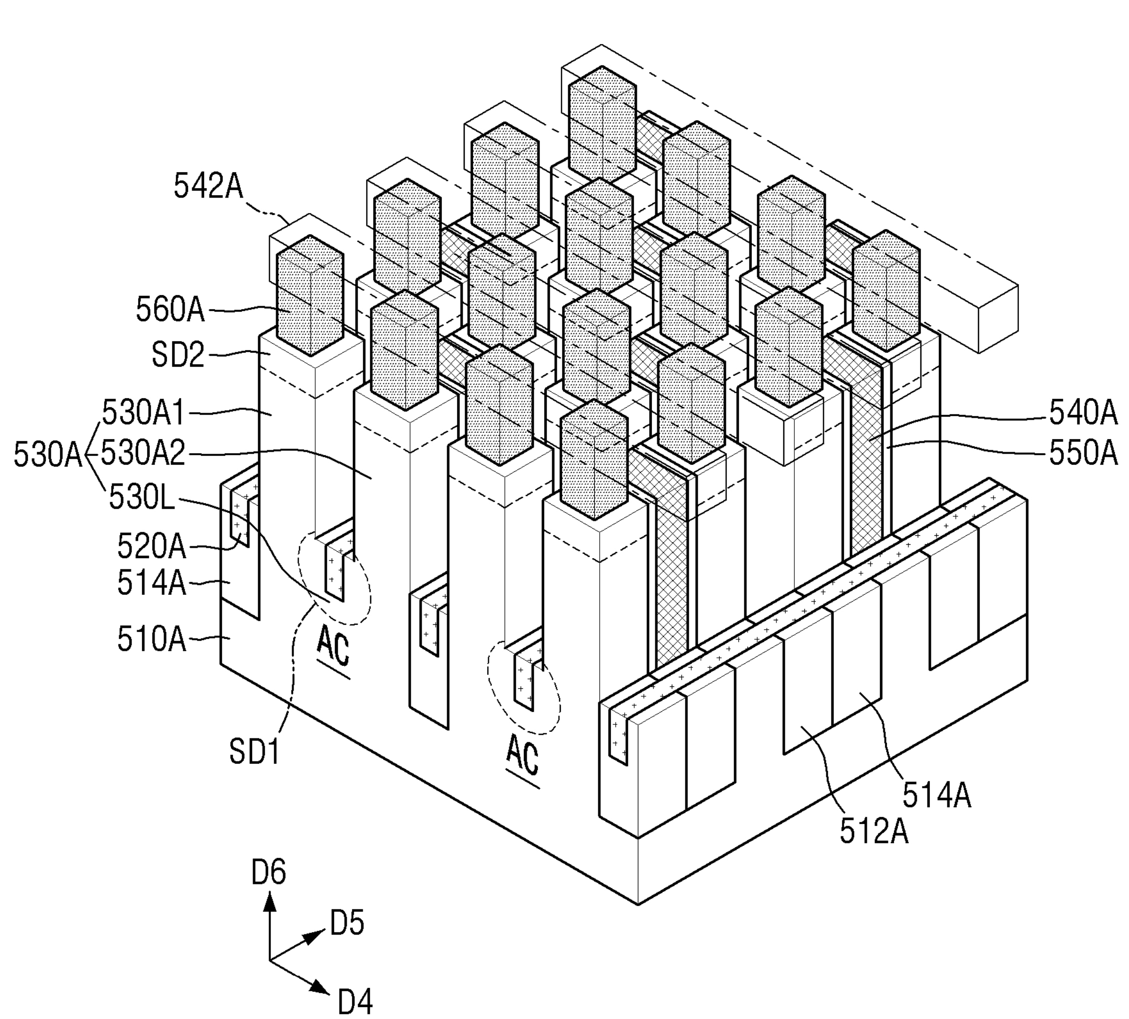
FIG. 14 is a perspective view illustrating a semiconductor device according to some embodiments of the present invention.

FIG. 13 is a layout diagram illustrating a semiconductor device according to some embodiments. FIG. 14 is a perspective view illustrating a semiconductor device according to some embodiments.

Referring to FIG. 13 and FIG. 14, a semiconductor device 500A may include a substrate 510A, a plurality of first conductive lines 520A, a channel structure 530A, a contact gate electrode 540A, a plurality of second conductive lines 542A, and a capacitor structure 580. The semiconductor device 500A may act as a memory device including a vertical channel transistor VCT.

A plurality of active regions AC may be formed in the substrate 510A and may be defined by a first element isolation film 512A and a second element isolation film 514A. Each channel structure 530A may be disposed in each active region AC. Each channel structure 530A may include a first active pillar 530A1 and a second active pillar 530A2 extending in the vertical direction, and a connection portion 530L connected to a bottom of the first active pillar 530A1 and a bottom of the second active pillar 530A2. A first source/drain area SD1 may be disposed in the connection portion 530L, while a second source/drain area SD2 may be disposed at a top of each of the first and second active pillars 530A1 and 530A2. Each of the first active pillar 530A1 and the second active pillar 530A2 may constitute an independent unit memory cell.

The plurality of first conductive lines 520A may extend in a direction intersecting each of the plurality of active region AC, for example, in the fifth direction D5. One first conductive line 520A of the plurality of first conductive lines 520A may be disposed on the connection portion 530L and between the first active pillar 530A1 and the second active pillar 530A2, and may be disposed on the first source/drain area SD1. Another first conductive line 520A adjacent to the one first conductive line 520A may be disposed between the two channel structures 530A. One first conductive line 520A of the plurality of first conductive line 520A may function as a common bit-line included in two unit memory cells respectively including the first active pillar 530A1 and the second active pillar 530A2 respectively disposed on both opposing sides of the one first conductive line 520A.

One contact gate electrode 540A may be disposed between two channel structures 530A adjacent to each other in the fifth direction D5. For example, one contact gate electrode 540A may be disposed between the first active pillar 530A1 included in one channel structure 530A and the second active pillar 530A2 included in another channel structure 530A adjacent thereto, while the one contact gate electrode 540 may be shared by the first active pillar 530A1 and the second active pillar 530A2 respectively disposed on both opposing sidewalls of the one contact gate electrode 540. A gate insulating layer 550A may be disposed between the contact gate electrode 540A and the first active pillar 530A1 and between the contact gate electrode 540A and the second active pillar 530A2. Each of the plurality of second conductive lines 542A may extend in a fourth direction D4 and may be disposed on a top face of each contact gate electrode 540A. Each of the plurality of second conductive lines 542A may function as a word-line of the semiconductor device 500A.

Each capacitor contact 560A may be disposed on each channel structure 530A. The capacitor contact 560A may be disposed on the second source/drain area SD2. Each capacitor structure 580 may be disposed on each capacitor contact 560A.

In concluding the detailed description, those skilled in the art will appreciate that many variations and modifications may be made to the preferred embodiments without substantially departing from the principles of the present disclosure. Therefore, the disclosed embodiments of the disclosure are used in a generic and descriptive sense only and not for purposes of limitation.

What is claimed is:

1. A composition for manufacturing a thin film, the composition comprising a compound having a structure of Chemical Formula 1:

[Chemical Formula 1]

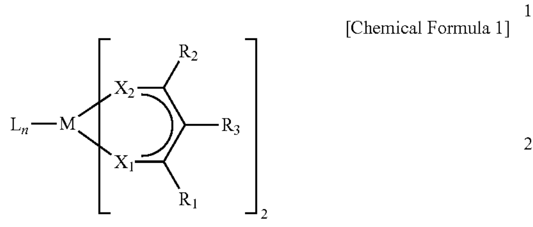

wherein M is strontium (Sr) or barium (Ba), $X_1$ and $X_2$ are each independently oxygen (O) or a substituted or unsubstituted alkylamino group having 1 to 5 carbon atoms, $R_1$ and $R_2$ are each independently a perfluoro alkyl group having 1 to 5 carbon atoms, wherein $R_1$ and $R_2$ are different from each other, $R_3$ is hydrogen or a substituted or unsubstituted alkyl group having 1 to 5 carbon atoms, L is a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n is an integer of 1 to 6.

2. The composition according to claim 1, wherein L has a structure of Chemical Formula 2:

[Chemical Formula 2]

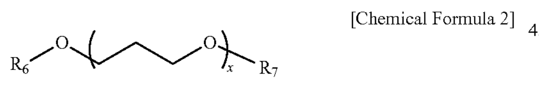

wherein $R_6$ and $R_7$ are each independently a methyl group, an ethyl group, an n-propyl group, an isopropyl group, an n-butyl group, a tert-butyl group, a sec-butyl group, or a substituted or unsubstituted perfluoroalkyl group having 1 to 4 carbon atoms, and wherein X is an integer of 1 to 5.

3. The composition according to claim 2, wherein L includes at least one of diglyme and tetraethylene glycol dimethyl ether (tetraglyme).

4. The composition according to claim 1, wherein L includes at least one of TMEDA (tetramethlyethlyenediamine) and HMTETA (hexamethyltriethylenetriamine).

5. The composition according to claim 1, wherein $X_1$ and $X_2$ are the same.

6. The composition according to claim 1, wherein $X_1$ and $X_2$ are different from each other.

7. The composition according to claim 1, wherein the compound having the structure of Chemical Formula 1 is in a liquid state at room temperature.

8. The composition according to claim 1, wherein a melting point of the compound having the structure of Chemical Formula 1 is 60° C. or lower.

9. A method for manufacturing a semiconductor device, the method comprising:

providing a substrate including an active region;

forming a lower electrode on the substrate so as to be connected to the active region; and forming a capacitor dielectric film disposed along a profile of the lower electrode, wherein forming the capacitor dielectric film includes sequentially providing a composition for manufacturing a thin film, and a metal, wherein the composition for manufacturing the thin film includes a compound having a structure of Chemical Formula 1:

[Chemical Formula 1]

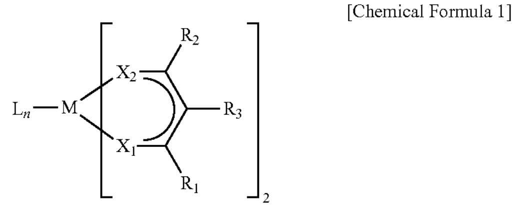

wherein M is strontium (Sr) or barium (Ba), $X_1$ and $X_2$ are each independently oxygen (O) or a substituted or unsubstituted alkylamino group having 1 to 5 carbon atoms, $R_1$ and $R_2$ are each independently a perfluoro alkyl group having 1 to 5 carbon atoms, wherein $R_1$ and $R_2$ are different from each other, $R_3$ is hydrogen or a substituted or unsubstituted alkyl group having 1 to 5 carbon atoms, L is a substituted or unsubstituted polyether having 1 to 6 oxygen atoms, a substituted or unsubstituted polyamine having 1 to 6 nitrogen atoms, or a substituted or unsubstituted polyetheramine having 1 to 6 oxygen atoms and 1 to 6 nitrogen atoms, and n is an integer of 1 to 6.

10. The method according to claim 9, wherein the capacitor dielectric film includes at least one of $SrTiO_3$, $BaTiO_3$, or $SrBaTi_2O_6$.

11. The method according to claim 9, wherein the compound having the structure of Chemical Formula 1 is in a liquid state at room temperature.

12. The method according to claim 9, wherein L has a structure of Chemical Formula 2:

[Chemical Formula 2]

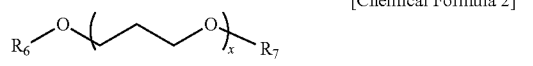

wherein $R_6$ and $R_7$ are each independently a methyl group, an ethyl group, an n-propyl group, an isopropyl group, an n-butyl group, a tert-butyl group, a sec-butyl group, or a substituted or unsubstituted perfluoroalkyl group having 1 to 4 carbon atoms, and wherein X is an integer of 1 to 5.

13. The method according to claim 9, wherein L includes at least one of diglyme and tetraethylene glycol dimethyl ether (tetraglyme).

14. The method according to claim 9, wherein L includes at least one of TMEDA (tetramethlyethlyenediamine) and HMTETA (hexamethyltriethylenetriamine).

15. The method according to claim 9, wherein $X_1$ and $X_2$ are the same.

* * * * *